United States Patent
Balakrishnan et al.

(10) Patent No.: US 9,786,768 B1
(45) Date of Patent: *Oct. 10, 2017

(54) III-V VERTICAL FIELD EFFECT TRANSISTORS WITH TUNABLE BANDGAP SOURCE/DRAIN REGIONS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/399,024

(22) Filed: Jan. 5, 2017

Related U.S. Application Data

(63) Continuation of application No. 15/156,597, filed on May 17, 2016.

(51) Int. Cl.
*H01L 29/66* (2006.01)
*H01L 29/78* (2006.01)
(Continued)

(52) U.S. Cl.
CPC ........ *H01L 29/66795* (2013.01); *H01L 29/20* (2013.01); *H01L 29/41791* (2013.01); *H01L 29/66553* (2013.01); *H01L 29/785* (2013.01)

(58) Field of Classification Search
CPC ............ H01L 29/78642; H01L 29/201; H01L 29/205; H01L 29/207; H01L 29/42392;
(Continued)

(56) References Cited

U.S. PATENT DOCUMENTS

| 5,068,705 A * | 11/1991 | Tran ................... H01L 27/0623 257/192 |
| 6,943,407 B2 | 9/2005 | Ouyang et al. |

(Continued)

OTHER PUBLICATIONS

NANOHUB.ORG, "Wiki: AQME Advancing Quantum Mechanics for Engineers," https://nanohub.org/wiki/AQME?version=96, Aug. 2008, 9 pages.

*Primary Examiner* — Scott B Geyer
(74) *Attorney, Agent, or Firm* — Louis J. Percello; Ryan, Mason & Lewis, LLP

(57) ABSTRACT

Vertical field effect transistor (FET) device with tunable bandgap source/drain regions are provided, as well as methods for fabricating such vertical FET devices. For example, a vertical FET device includes a lower source/drain region formed on a substrate, a vertical semiconductor fin formed on the lower source/drain region, and an upper source/drain region formed on an upper region of the vertical semiconductor fin. The lower source/drain region and vertical semiconductor fin are formed of a first type of III-V semiconductor material. The upper source/drain region is formed of a second type of III-V semiconductor material which comprises the first type of III-V semiconductor material and at least one additional element that increases a bandgap of the second type of III-V semiconductor material of the upper source/drain region relative to a bandgap of the first type of III-V compound semiconductor material of the lower source/drain region and the vertical semiconductor fin.

20 Claims, 20 Drawing Sheets

(51) Int. Cl.
*H01L 29/417* (2006.01)
*H01L 29/20* (2006.01)

(58) Field of Classification Search
CPC ......... H01L 29/66522; H01L 29/66666; H01L 29/66742; H01L 29/78618; H01L 29/78681; H01L 29/78; H01L 29/7827; H01L 29/785; H01L 29/7853; H01L 29/7858; H01L 29/66787; H01L 29/66795; H01L 29/66818
See application file for complete search history.

(56) References Cited

U.S. PATENT DOCUMENTS

| | | |
|---|---|---|
| 8,384,122 B1 | 2/2013 | Hu et al. |
| 8,633,470 B2 | 1/2014 | Radosavljevic |
| 9,368,388 B2 | 6/2016 | Liaw |
| 2007/0148939 A1 | 6/2007 | Chu et al. |
| 2012/0187376 A1 | 7/2012 | Tomioka et al. |
| 2016/0204224 A1* | 7/2016 | Fukui ............... B82Y 10/00 438/198 |

* cited by examiner

III-V VERTICAL FIELD EFFECT TRANSISTORS WITH TUNABLE BANDGAP SOURCE/DRAIN REGIONS

TECHNICAL FIELD

This disclosure relates generally to semiconductor fabrication techniques and, in particular, to structures and methods for fabricating vertical FET (field effect transistor) devices.

BACKGROUND

Traditional CMOS (complementary metal oxide semiconductor) techniques include process flows for constructing planar FET devices. With planar FETs, increased transistor density can be achieved by decreasing the pitch between transistor gate elements. However, with planar FET devices, the ability to decrease gate pitch is limited by the required gate length, spacer thickness, and source/drain size. In recent years, there has been significant research and development with regard to vertical FET devices, which decouple the gate length from the gate pitch requirement and enable scaling of transistor density. In general, vertical FET devices are designed to have gate structures that are formed on sidewalls of a vertical channel structure (e.g., a vertical semiconductor fin or vertical nanowire). Further, vertical FET devices include doped source/drain regions, wherein one doped source/drain region is formed on top of the vertical channel structure, and wherein another doped source/drain region is formed underneath the vertical channel structure. With vertical FET devices, scaling is determined by how closely conductive contacts to source and drain regions can be placed. With current state of the art technologies, vertical FET structures are suitable for technology nodes of 5 nm and beyond. In addition, the use of III-V compound semiconductor materials to form source/drain regions and vertical channel structures for vertical FET devices is highly desirable due to the increased electron mobility of III-V compound semiconductor materials.

SUMMARY

Embodiments of the invention include vertical FET devices with tunable bandgap source/drain regions, as well as methods for fabricating vertical FET devices with tunable bandgap source/drain regions. For example, one embodiment includes a semiconductor device which comprises a vertical FET device formed on a semiconductor substrate. The vertical FET device comprises a lower source/drain region formed on the semiconductor substrate, a vertical semiconductor fin formed on an upper surface of the lower source/drain region, and an upper source/drain region formed on an upper region of the vertical semiconductor fin. The lower source/drain region and the vertical semiconductor fin are formed of a first type of III-V compound semiconductor material. The upper source/drain region is formed of a second type of III-V semiconductor material which comprises the first type of III-V compound semiconductor material and at least one additional element. The additional element increases a bandgap of the second type of III-V compound semiconductor material that forms the upper source/drain region relative to a bandgap of the first type of III-V compound semiconductor material that forms the lower source/drain region and the vertical semiconductor fin.

In one embodiment, the first type of III-V compound semiconductor material comprises a ternary III-V compound semiconductor material, and the second type of III-V compound semiconductor material comprises a quaternary III-V compound semiconductor material. For example, in one embodiment, the first type of III-V compound semiconductor material comprises a composition of InGaAs (indium gallium arsenside), and the second type of III-V compound semiconductor material comprises a composition of InGaAlAs (indium gallium aluminum arsenside). In another embodiment, the first type of III-V compound semiconductor material comprises a composition of InGaSb (indium gallium antimonide), and the second type of III-V compound semiconductor material comprises a composition of InGaAlSb (indium gallium aluminum antimonide).

Another embodiment of the invention includes a method of fabricating a semiconductor device. The method includes epitaxially growing a lower source/drain region on a semiconductor substrate, epitaxially growing a vertical semiconductor fin on an upper surface of the lower source/drain region, and epitaxially growing an upper source/drain region on an upper region of the vertical semiconductor fin. The lower source/drain region and the vertical semiconductor fin are formed of a first type of III-V compound semiconductor material. The upper source/drain region is formed of a second type of III-V semiconductor material which comprises the first type of III-V compound semiconductor material and at least one additional element. The additional element increases a bandgap of the second type of III-V compound semiconductor material that forms the upper source/drain region relative to a bandgap of the first type of III-V compound semiconductor material that forms the lower source/drain region and the vertical semiconductor fin. When epitaxially growing the upper source/drain region on the upper region of the vertical semiconductor fin, an amount of the at least one additional element that is added to the first type of III-V compound semiconductor material is controlled to tune a bandgap of the upper source/drain region to a target value.

Other embodiments will be described in the following detailed description of embodiments, which is to be read in conjunction with the accompanying figures.

BRIEF DESCRIPTION OF THE DRAWINGS

FIGS. 3 through 19 schematically illustrate a method for fabricating the semiconductor structure of FIGS. 1A/1B, according to an embodiment of the invention, wherein:

FIG. 3 is a cross-sectional view of a semiconductor structure at an initial stage of fabrication starting with a stack of layers sequentially formed on a semiconductor substrate;

FIG. 4 is a schematic cross-sectional view of the semiconductor structure of FIG. 3 after etching a trench opening through layers of the stack down to a first spacer layer;

FIG. 5 is a schematic cross-sectional view of the semiconductor structure of FIG. 4 after forming a thin layer of oxide on exposed sidewalls surfaces of a dummy gate layer within the trench opening;

FIG. 6 is a schematic cross-sectional view of the semiconductor structure of FIG. 5 after etching an exposed portion of the first spacer layer at the bottom of the trench opening down to a lower source/drain region;

FIG. 7 is a schematic cross-sectional view of the semiconductor structure of FIG. 6 after forming a vertical semiconductor fin in the trench opening;

FIG. 8 is schematic cross-sectional view of the semiconductor structure of FIG. 7 after recessing an upper portion of the vertical semiconductor fin down below a planarized surface of an insulating layer, and filling the upper portion of the trench opening with a capping layer;

FIG. 9 is schematic cross-sectional view of the semiconductor structure of FIG. 8 after etching away the insulating layer down to a second spacer layer, forming a thinned vertical fin structure, and epitaxially growing an upper source/drain region on the thinned vertical fin structure;

FIG. 10 is a schematic cross-sectional side view of the semiconductor structure of FIG. 9 after forming an encapsulation structure that encapsulates the upper source/drain region;

FIG. 11 is a schematic cross-sectional side view of the semiconductor structure of FIG. 10 after vertically etching the stack of layers on the substrate down to the first spacer layer to form an upper spacer and a dummy gate structure;

FIG. 12 is a schematic cross-sectional side view of the semiconductor structure of FIG. 11 after sequentially removing the dummy gate structure and the oxide layer to expose the sidewall surfaces of the vertical semiconductor fin;

FIG. 13 is a schematic cross-sectional side view of the semiconductor structure of FIG. 12 after sequentially depositing a thin conformal layer of gate dielectric material and a thin conformal layer of metallic gate material;

FIG. 14 is a schematic cross-sectional side view of the semiconductor structure of FIG. 13 after depositing and planarizing a layer of gate electrode material which is subsequently patterned to form a gate electrode;

FIG. 15 is a schematic cross-sectional side view of the semiconductor structure of FIG. 14 after recessing the layer of gate electrode material;

FIG. 16 is a schematic cross-sectional side view of the semiconductor structure of FIG. 15 after removing exposed portions of the conformal layer of gate dielectric material and the conformal layer of metallic gate material;

FIG. 17 is a schematic cross-sectional side view of the semiconductor structure of FIG. 16 after patterning the recessed layer of gate electrode material and remaining portions of the gate dielectric material layer and the metallic gate material layer, to form a metal gate structure that surrounds the sidewalls of the vertical semiconductor fin;

FIG. 18 is a schematic cross-sectional side view of the semiconductor structure of FIG. 17 after depositing and planarizing a layer of dielectric material to form an ILD (interlayer dielectric) layer; and FIG. 19 is a schematic cross-sectional side view of the semiconductor structure of FIG. 18 after etching a pattern of contact openings which are subsequently filled with conductive material to form vertical source, drain and gate contacts as shown in FIGS. 1A and 1B.

DETAILED DESCRIPTION OF EMBODIMENTS

Embodiments of the invention will now be described in further detail with regard to vertical FET devices with tunable bandgap source/drain regions, as well as methods for fabricating vertical FET devices with tunable bandgap source/drain regions. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1A:
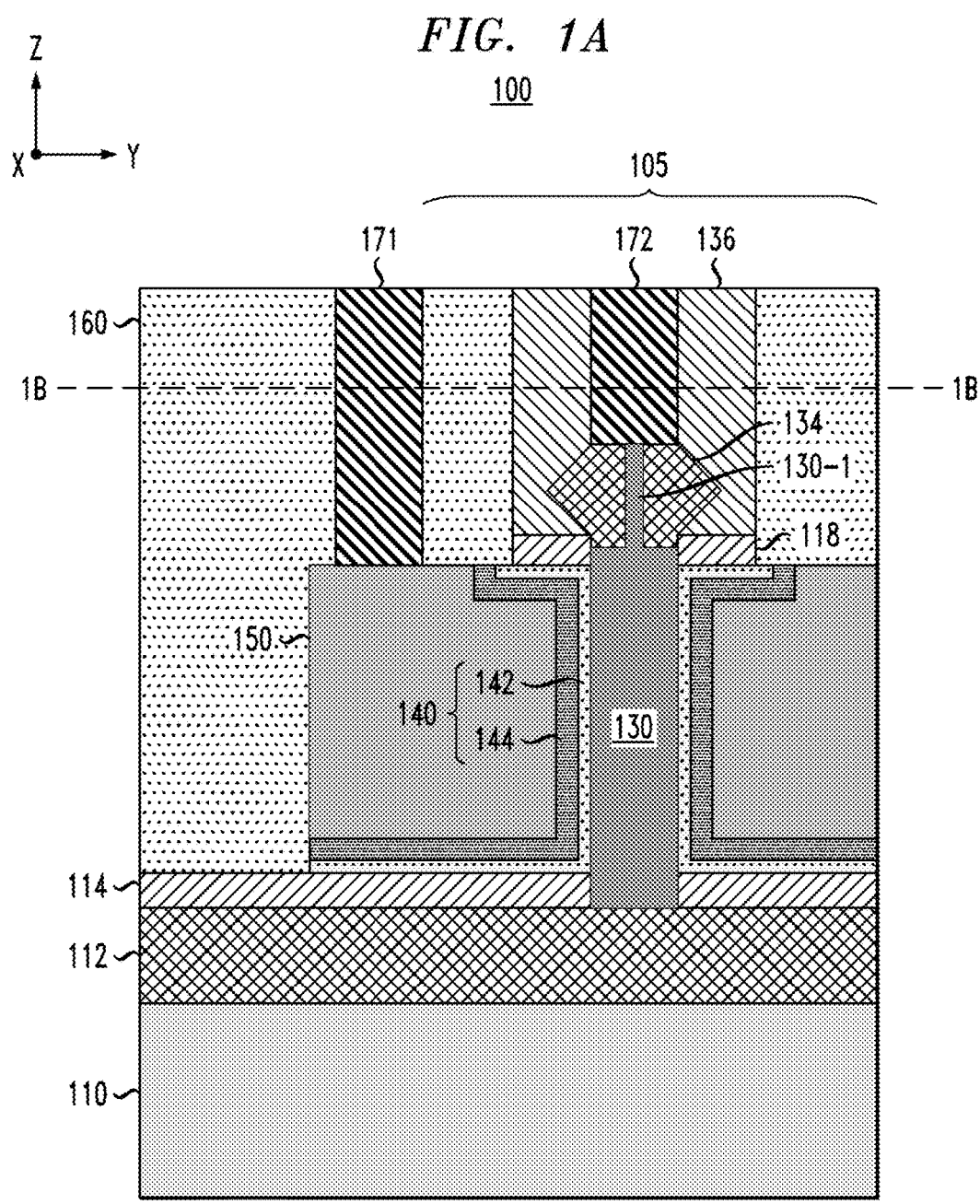
FIGS. 1A and 1B are schematic views of a semiconductor structure comprising a vertical FET device, according to an embodiment of the invention.
Figure 1B:
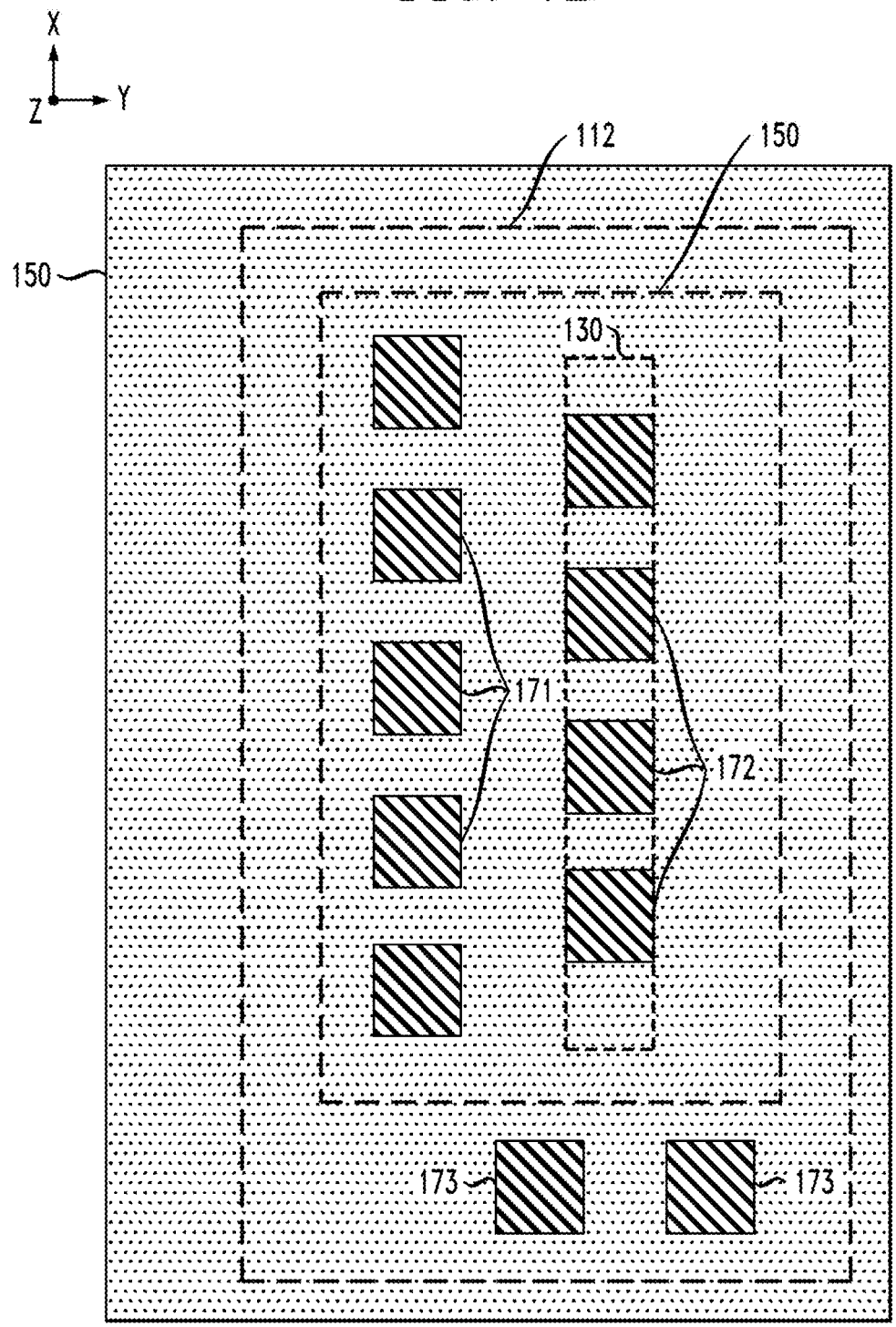

FIGS. 1A and 1B are schematic views of a semiconductor structure 100 comprising a vertical FET device, according to an embodiment of the invention. In particular, FIG. 1A is a schematic cross-sectional view of the semiconductor structure 100 in an Y-Z plane, as indicated by the XYZ Cartesian coordinates shown in FIG. 1A. In addition, FIG. 1B is a top plan view of the semiconductor structure 100 at line 1B-1B in FIG. 1A in an X-Y plane as indicated by the XYZ Cartesian coordinates shown in FIG. 1B. It is to be understood that the terms "vertical" or "vertical direction" as used herein denotes a Z-direction of the Cartesian coordinates shown in FIGS. 1A/1B, and that the terms "horizontal" or "horizontal direction" as used herein denotes an X-direction and/or Y-direction of the Cartesian coordinates shown in FIGS. 1A/1B, which is perpendicular to the Z-direction.

As shown in FIG. 1A, the semiconductor structure 100 comprises vertical FET device 105 formed on a semiconductor substrate 110. The vertical FET device 105 comprises a lower source/drain region 112, a lower spacer 114, a vertical semiconductor fin 130 (or vertical channel structure), an upper spacer 118, and an upper source/drain region 134 formed on a thinned upper portion 130-1 of the vertical semiconductor fin 130. The vertical semiconductor fin 130 serves as a vertical channel region of the vertical FET device 105, which connects the lower source/drain region 112 and the upper source/drain region 134. In one embodiment of the invention, the lower and upper source/drain regions 112 and 134, and the semiconductor fin 130 are formed of epitaxial III-V compound semiconductor materials. As explained in further detail below, the upper source/drain region 134 can have a composition that is engineered to tune a bandgap (e.g., increase bandgap) of the upper source/drain region 134 to meet a variety of power and/or performance targets. It is to be understood that the term "source/drain region" as used herein means that a given source/drain region can be either a source region or a drain region, depending on the application. For example, in one embodiment, the lower source/ drain region 112 comprises a source region, while the upper source/drain region 134 comprises a drain region.

The vertical FET device further comprises a metal gate structure (140/150) formed on and around the vertical sidewalls of the vertical semiconductor fin 130. The metal gate structure (140/150) comprises a high-k metal gate stack structure 140 and a gate electrode 150. The high-k metal gate stack structure 140 comprise a gate dielectric layer 142 and a metallic gate layer 144 (e.g., work function metal layer), which are formed around the vertical sidewalls of the vertical semiconductor fin 130. In addition, a gate electrode 150 is formed in contact with the high-k metal gate stack structure 140 and surrounds the vertical sidewalls of the vertical semiconductor fin 130. The lower spacer 114 electrically insulates the lower source/drain region 112 from the metal gate structure (140/150), and the upper spacer 118 electrically insulates the upper source/drain region 134 from the metal gate structure (140/150). The upper source/drain region 134 is protected by an encapsulation structure 136.

As further shown in FIGS. 1A/1B, the semiconductor structure 100 further comprises an ILD (interlayer dielectric) layer 160 and a plurality of vertical contacts 171, 172 and 173. The vertical contacts 171 are formed through the ILD layer 160 to contact the gate electrode 150. The vertical contacts 172 are formed through the encapsulation layer 136 to contact the upper source/drain region 134. The vertical contacts 173 (shown in FIG. 1B) are formed through the ILD layer 160 and the lower spacer 114 to contact the lower source/drain region 112. FIG. 1B is a top plan view of FIG. 1A which schematically illustrates (via dashed outlines) example embodiments of the footprint areas of the vertical semiconductor fin 130, the lower source/drain region 112, and the gate electrode 150. In addition, FIG. 1B shows an example layout/arrangement of a plurality of the vertical contacts 171, 172, and 173 in relation to the footprint areas outlined in FIG. 1B.

In particular, as shown in the example embodiment of FIG. 1B, the lower source/drain region 112 has a footprint size which is larger than a footprint size of the gate electrode 150 to thereby provide sufficient area to accommodate the vertical contacts 173. In one embodiment, as shown in FIG. 1B, the vertical contacts 173 are formed to make contact with a region of the lower source/drain region 112 that laterally extends from one end of the semiconductor fin 130. Moreover, the vertical contacts 171 are formed to make contact with a region of gate electrode 150 that laterally extends from one side of the semiconductor fin 130. In other embodiments, the gate electrode 150 and lower source/drain region 112 can be formed with other types of footprints of varying shapes and sizes to accommodate different layouts/arrangements of the vertical contacts 171 and 173. Moreover, the vertical contacts 171 to gate electrode 150 and the vertical contacts 173 to the lower source/drain region 112 can be formed with different geometric profiles (e.g., elongated contacts) or disposed on other sides of the vertical FET structure (e.g., adjacent the long ends of the vertical semiconductor fin 130, adjacent both long sides of the vertical semiconductor fin 130, etc.).

It is to be understood that for ease of illustration and discussion, FIGS. 1A and 1B show a single vertical FET device 105 of the semiconductor structure 100. The semiconductor structure 100 comprise other components including, for example, a plurality of vertical FET devices and other active and passive components forming integrated circuitry. In addition, the semiconductor structure 100 comprises shallow trench isolation (STI) regions formed in or on the surface of the substrate 110, wherein the STI regions define and isolate different device regions in which individual vertical FET devices are formed, etc. Moreover, although one vertical semiconductor fin 130 is shown in FIGS. 1A/1B for ease of illustration, in another embodiment of the invention, a vertical FET device can include a plurality of vertical semiconductor fins that are formed on the lower source/drain region 112, to provide additional FET channel segments to increase the drive current of the vertical FET device.

As noted above, in one embodiment of the invention, the lower and upper source/drain regions 112 and 134, and the semiconductor fin 130 are formed of III-V semiconductor materials, wherein the upper source/drain region 134 is fabricated with a custom composition that serves to tune a bandgap of the upper source/drain region 134 to achieve target operating characteristics of the vertical FET device 105. As is known in the art, with regard to a semiconductor material, the term "bandgap" generally denotes an energy difference (in electron volts (eV)) between a valence band and a conduction band of the semiconductor material (i.e., the energy range in which no electron states can exist). In this regard, the electrical conductivity of a given semiconductor material depends on the valance and conduction bands of the semiconductor material. In accordance with embodiments of the invention, as discussed in further detail below with reference to FIG. 2, bandgap tuning methods are provided for controlling or altering the bandgap of a given source/drain region by controlling the composition of the semiconductor alloy material that is used to form the given source/drain region.

In one embodiment, the substrate 110 comprises bulk semiconductor substrate formed of a III-V compound semiconductor material such as indium phosphide (InP), gallium arsenide (GaAs), indium arsenide (InAs), InGaAs (Indium Gallium Arsenide), or other types of compound semiconductor materials that are commonly used in bulk semiconductor fabrication processes, and which are suitable for the given application. In another embodiment, the substrate 110 may comprise a bulk silicon (Si) substrate having a layer of III-V compound semiconductor material such as GaAs formed on a surface of the bulk silicon substrate.

Furthermore, in one embodiment of the invention, the lower source/drain region 112 and the vertical semiconductor fin 130 are formed of a first type of III-V compound semiconductor material, and the upper source/drain region 1134 is formed of a second type of III-V semiconductor material which comprises the first type of III-V compound semiconductor material and at least one additional element, wherein an amount of the at least one additional element that is added to the first type of III-V compound semiconductor material is controlled to tune a bandgap of the upper source/drain region 134 to a target value. For example, the additional element can be added to increase a bandgap of the second type of III-V compound semiconductor material that forms the upper source/drain region 134 relative to a bandgap of the first type of III-V compound semiconductor material that forms the lower source/drain region 112 and the vertical semiconductor fin 130. The first type of III-V compound semiconductor material may comprise a ternary III-V compound semiconductor material, and the second type of III-V compound semiconductor material may comprise a quaternary III-V compound semiconductor material.

More specifically, in one embodiment, the lower source/drain region 112 is formed of an epitaxial III-V compound semiconductor compound material that is lattice matched to the substrate material of the surface of the semiconductor substrate 110. For example, in one embodiment of the invention, the lower source/drain region 112 is formed of an epitaxial InGaAs compound semiconductor material. In another embodiment, the lower source/drain region 112 is formed of an epitaxial InGaSb (Indium Gallium Antimonide) compound semiconductor material. The lower source/drain region 112 is n-doped or p-doped depending on whether the vertical FET device is an n-type vertical FET device or a p-type vertical FET device. In general, a group III-V compound semiconductor material is n-doped using atoms such as Tellurium (Te), Selenium (Se), etc., or p-doped using atoms such as Beryllium (Be), Zinc (Zn), etc. In addition, a group III-V compound semiconductor material can also be doped using Si or Ge atoms as either donors or acceptors, depending on which element (group III or ground V) is replaced by the Si or Ge atoms.

Further, in one embodiment of the invention, the vertical semiconductor fin 130 is formed of an epitaxial III-V compound semiconductor material that has the same or similar lattice constant as the epitaxial III-V compound semiconductor material that is used to form the lower source/drain region 112. For example, if the lower source/drain region 112 is formed of a composition of InGaAs compound semiconductor material, the vertical semiconductor fin 130 can be formed of a composition of InGaAs compound semiconductor material. Alternatively, if the lower source/drain region 112 is formed of a composition of InGaSb compound semiconductor material, the vertical semiconductor fin 130 can be formed of a composition of InGaSb compound semiconductor material. In addition, the III-V compound semiconductor material of the vertical semiconductor fin can be undoped, or lightly doped with the same or similar type of dopant used to dope the lower source/drain region 112.

Further, the upper source/drain region 134 is formed of an epitaxial III-V compound semiconductor material that has the same or similar lattice constant as the epitaxial III-V compound semiconductor material that is used to form the semiconductor fin 130. In particular, as noted above, in one embodiment of the invention, the upper source/drain region 134 is formed of a second type of III-V semiconductor material which comprises the first type of III-V compound semiconductor material (which forms vertical semiconductor fin 130), but which includes at least one additional element (e.g., Al (aluminum)) to tune the bandgap of the upper source/drain region 134 to a target value. For example, in one embodiment, when the first type of III-V compound semiconductor material comprises a composition of InGaAs, the second type of III-V compound semiconductor material comprises a composition of InGaAlAs (indium gallium aluminum arsenside). In another embodiment, when the first type of III-V compound semiconductor material comprises a composition of InGaSb, and the second type of III-V compound semiconductor material comprises a composition of InGaAlSb (indium gallium aluminum antimonide).

Figure 2:
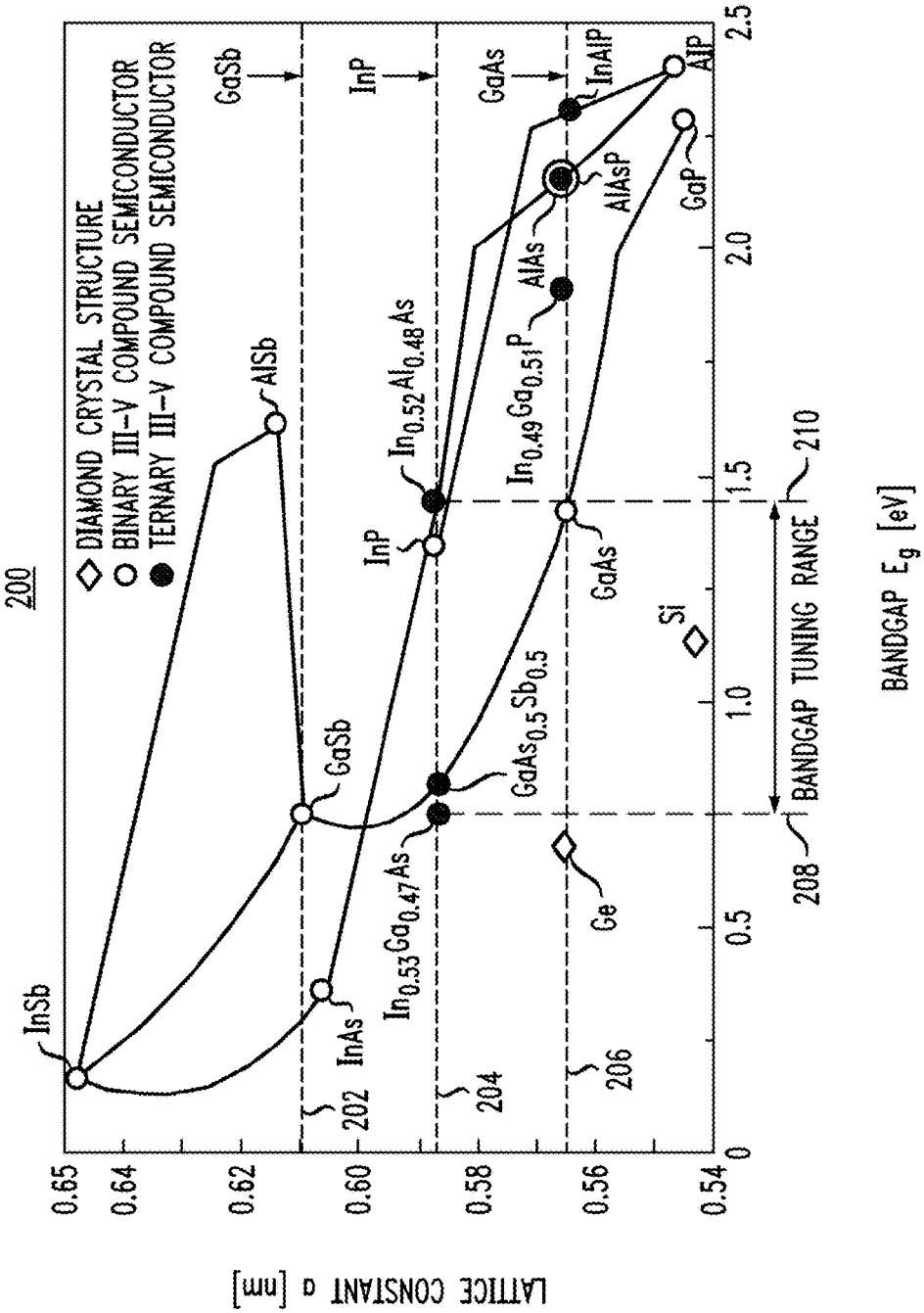
FIG. 2 graphically illustrates a process for tuning the bandgap of a source/drain region which is formed of a III-V compound semiconductor material, according to an embodiment of the invention.

In one embodiment of the invention, aluminum (Al) atoms are added to the III-V compound semiconductor material that forms the upper source/drain region 134 to tune the bandgap of the upper source/drain region 134, using a tuning process as graphically illustrated in FIG. 2. In particular, FIG. 2 graphically illustrates a process for tuning the bandgap of a source/drain region which is formed of a III-V compound semiconductor material, according to an embodiment of the invention. FIG. 2 shows a graph 200 having a vertical axis which represents a crystal lattice constant a (nm) in a range from 0.54 to 0.65, for various materials such as Si and Ge (which have a diamond cubic crystal structure), and binary and ternary III-V compound semiconductor materials. Further, a horizontal axis of the graph 200 represents a bandgap energy $E_g$ in a range from 0 eV to 2.5 eV. The graph 200 comprises a plurality of horizontal dashed lines 202, 204, and 206 which respectively represent the lattice constants a for GaSb, InP, and GaAs compound semiconductor materials, which can be used to form the substrate 110 in FIG. 1A.

In addition, the graph 200 comprises a plurality of vertical dashed lines 208 and 210 which represent the bandgap energies of certain compositions of InGaAs and InAlAs compound semiconductor materials. More specifically, as shown in FIG. 2, the compound semiconductor material $In_{0.53}Ga_{0.47}As$ has a bandgap of about 0.75 eV (as denoted by dashed line 208), and the compound semiconductor material $In_{0.52}Al_{0.48}As$ has a bandgap of about 1.45 eV (as denoted by dashed line 210). FIG. 2 further illustrates that the compound semiconductor materials InGaAs and InAlAs have lattice constants that are essentially the same as InP. A composition of InGaAs material, which is formed of a combination of InAs and GaAs alloys, is generally denoted as $In_xGa_{1-x}As$ where x is the proportion of InAs and 1−x is the proportion of GaAs. The InGaAs compound has a band gap which can be tuned by changing the composition of InGaAs to include Al, wherein the relative amount of Al and Ga is varied to create a custom composition of InAlGaAs with a custom band gap.

By way of specific example, FIG. 2 shows a method for controlling or altering the composition of InGaAs by adding Al atoms (in place of the Ga atoms) to increase (widen) the bandgap of the InGaAs material within a "bandgap tuning range" delineated by the vertical dashed lines 208 and 210. In particular, in one embodiment of the invention where the upper and lower source/drain regions 134 and 112 and vertical semiconductor fin 130 are formed of InGaAs semiconductor material (for an n-type vertical FET device), the bandgap of the upper source/drain region 134 (e.g., drain region) can be increased by adding Al atoms (in place of the Ga atoms) at a target concentration to increase the bandgap of the upper source/drain region 134 from about 0.75 eV (dashed line 208) to a desired bandgap energy within the "bandgap tuning range" up to about 1.45 eV (dashed line 210). At the high end (dashed line 210) of the "bandgap tuning range," essentially all Ga atoms are replaced with Al atoms to form an InAlAs compound semiconductor material, which is still lattice matched to the InGaAs material of the vertical semiconductor fin 130 on which the upper source/drain region 134 is epitaxially grown.

In one embodiment of the invention, the bandgap of the drain region (e.g., upper source/drain region 134) is increased using bandgap tuning techniques discussed herein to decrease "off-state" drain leakage current due to band-to-band tunneling which takes place at a drain edge of the vertical channel. Indeed, increasing the bandgap of the drain region prevents carriers from tunneling into the vertical channel from the drain region, thereby reducing power consumption of the vertical FET device. While increasing the bandgap of the source region (e.g., lower source/drain region 112) may be achieved using bandgap tuning techniques discussed herein, source leakage due to tunneling current from the source region is not as significant as drain leakage due to tunneling especially in applications where the source region is connected to the body (or bulk) terminal of the semiconductor substrate 110 or otherwise connected to fixed potential.

While increasing the bandgap of the drain region results in reduced drain leakage, the increase in bandgap also increases external resistance which can result in less current in the vertical FET device. In this regard, bandgap tuning can be performed to achieve a drain region bandgap which balances a decrease in power consumption (with increased bandgap) against a decrease in performance due to higher external resistance (with increased bandgap).

It is to be understood that while FIGS. 1A/1B show one vertical FET device 105, the semiconductor structure 100 can include any number of vertical FET devices, depending on the application, wherein the bandgap tuning of the drain regions can vary between different vertical FET device of the same doping type (e.g., n-type or p-type) or different doping types, across the given integrated circuitry of the semiconductor structure 100. Moreover, while FIG. 2 specifically illustrates bandgap tuning for n-type vertical FET devices, bandgap tuning techniques as discussed herein can be applied to p-type vertical FET devices.

For example, for a p-type vertical FET device, the upper and lower source/drain regions 134 and 112 and vertical semiconductor fin 130 may be formed of epitaxial InGaSb compound semiconductor material, wherein the InGaSb source/drain regions 112 and 134 can be doped with p-type dopants such as Beryllium or Zinc. The bandgap of the upper source/drain region 134 (e.g., drain region) can be increased by adding Al atoms in the InGaSb material (in place of the Ga atoms) at a target concentration to increase the bandgap of the upper source/drain region 134 and reduce drain leakage as discussed above.

Methods for fabricating the semiconductor structure 100 shown in FIGS. 1A/1B will now be discussed in further detail with reference to FIGS. 3 through 19, which schematically illustrate the semiconductor structure 100 of FIGS. 1A/1B at various stages of fabrication. It is to be understood that the schematic views of the semiconductor structures in FIGS. 3-19 are perspective views of the semiconductor structure 100 of FIG. 1A at different stages of fabrication along the Y-Z plane shown in FIG. 1A.

Figure 3:
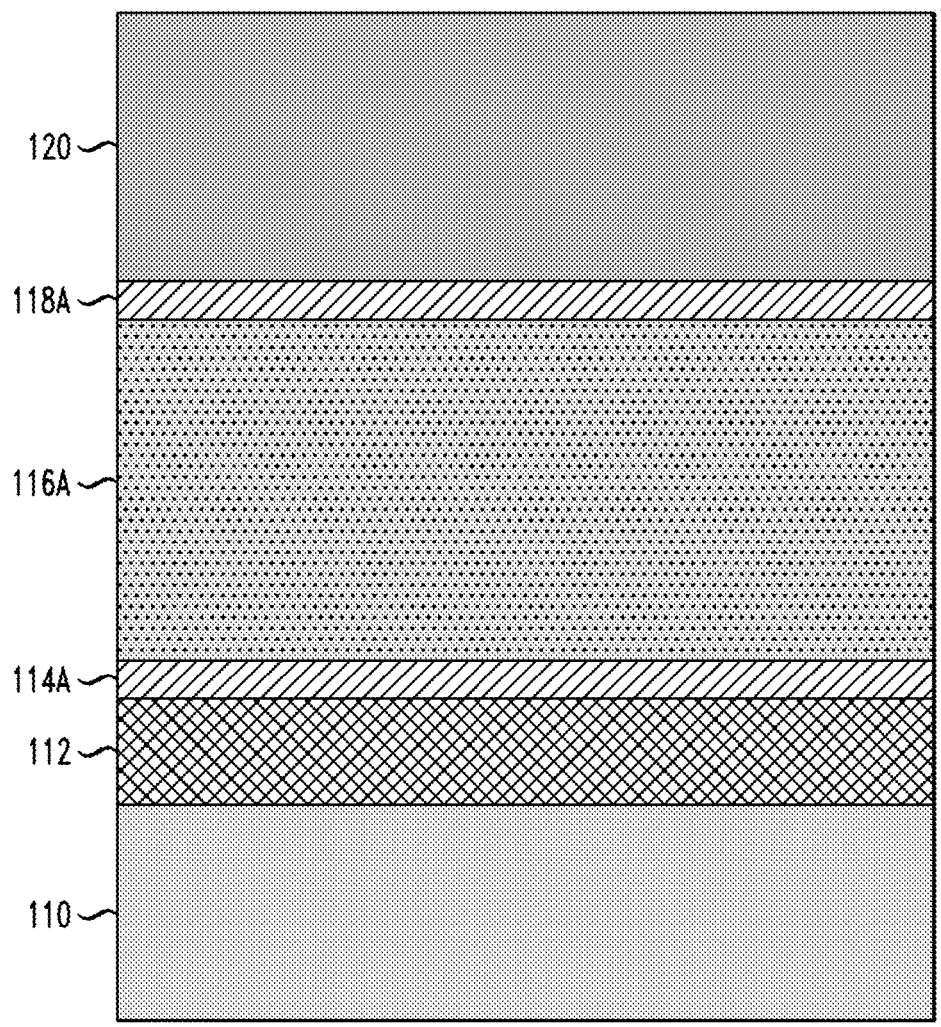

FIG. 3 is a cross-sectional view of a semiconductor structure at an initial stage of fabrication starting with the semiconductor substrate 110 (as shown in FIG. 1A) and a stack of layers 112, 114A, 116A, 118A, and 120 sequentially formed on the semiconductor substrate 110, according to an embodiment of the invention. As noted above, the substrate 110 may comprise a bulk semiconductor substrate formed of a III-V compound semiconductor material such as InP, GaAs, InAs, InGaAs, or a bulk Si substrate having a layer of III-V compound semiconductor material such as GaAs formed on a surface of the bulk Si substrate.

The stack of layers comprises the lower source/drain region 112, a first spacer layer 114A, a dummy gate layer 116A, a second spacer layer 118A, and an insulating layer 120, which are sequentially formed on top of the semiconductor substrate 110 using known techniques. In one embodiment of the invention, the lower source/drain region 112 comprises a III-V compound semiconductor material that is epitaxially grown on top of the semiconductor substrate 110 and doped in-situ during epitaxial growth, or doped ex-situ by ion implantation. The lower source/drain region 112 can be epitaxially grown using known techniques, such as MOCVD (metal-organic chemical vapor deposition), MBE (molecular beam epitaxy), VPE (vapor-phase epitaxy), MOMBE, or other known epitaxial growth techniques.

The epitaxially grown lower source/drain region 112 comprises a semiconductor material that is lattice-matched to the semiconductor material at the surface of the semiconductor substrate 110 on which the lower source/drain region 112 is grown. For example, for a n-type vertical FET device, the lower source/drain region 112 can be a heavily doped InGaAs layer that is doped with Tellurium. A single crystal epitaxial film of InGaAs material can be grown on a single crystal III-V semiconductor substrate having a lattice constant that is close to the InGaAs alloy material to be formed. In one exemplary embodiment, an $In_{0.53}Ga_{0.47}As$ film has a lattice parameter that matches that of InP. On the other hand, for a p-type vertical FET device, the lower source/drain region 112 may be a heavily doped InGaSb layer that is doped with Beryllium or Zinc, for example.

The first spacer layer 114A is formed on the lower source/drain region 112. In one embodiment, the first spacer layer 114A is formed of silicon nitride. The first spacer layer 114A is patterned during a subsequent fabrication step to form the lower insulating spacer 114 that serves to electrically insulate the lower source/drain region 112 of the vertical FET device 105 from the metal gate structure 140/150 of the vertical FET device 105.

The dummy gate layer 116A is formed of a sacrificial semiconductor material, such as amorphous silicon. The dummy gate layer 116A is subsequently patterned to form a dummy gate structure 116 (see FIG. 11) that surrounds the vertical semiconductor fin 130. The dummy gate structure 116 is subsequently removed and replaced with the metal gate structure 140/150 using a RMG (replacement metal gate) process flow, as discussed in further detail below.

The second spacer layer 118A is formed on the dummy gate layer 116A. In one embodiment, the second spacer layer 118A is formed of silicon nitride. The second spacer layer 118A is patterned during a subsequent fabrication step to form the upper insulating spacer 118 that electrically insulates the upper source/drain region 134 of the vertical FET device from the metal gate structure 140/150 of the vertical FET device 105. The insulating layer 120 is formed on the second spacer layer 118A. In one embodiment, the insulating layer 120 comprises a sacrificial material, such as silicon oxide, which can be etched selective to the material of the second spacer layer 118A.

Figure 4:
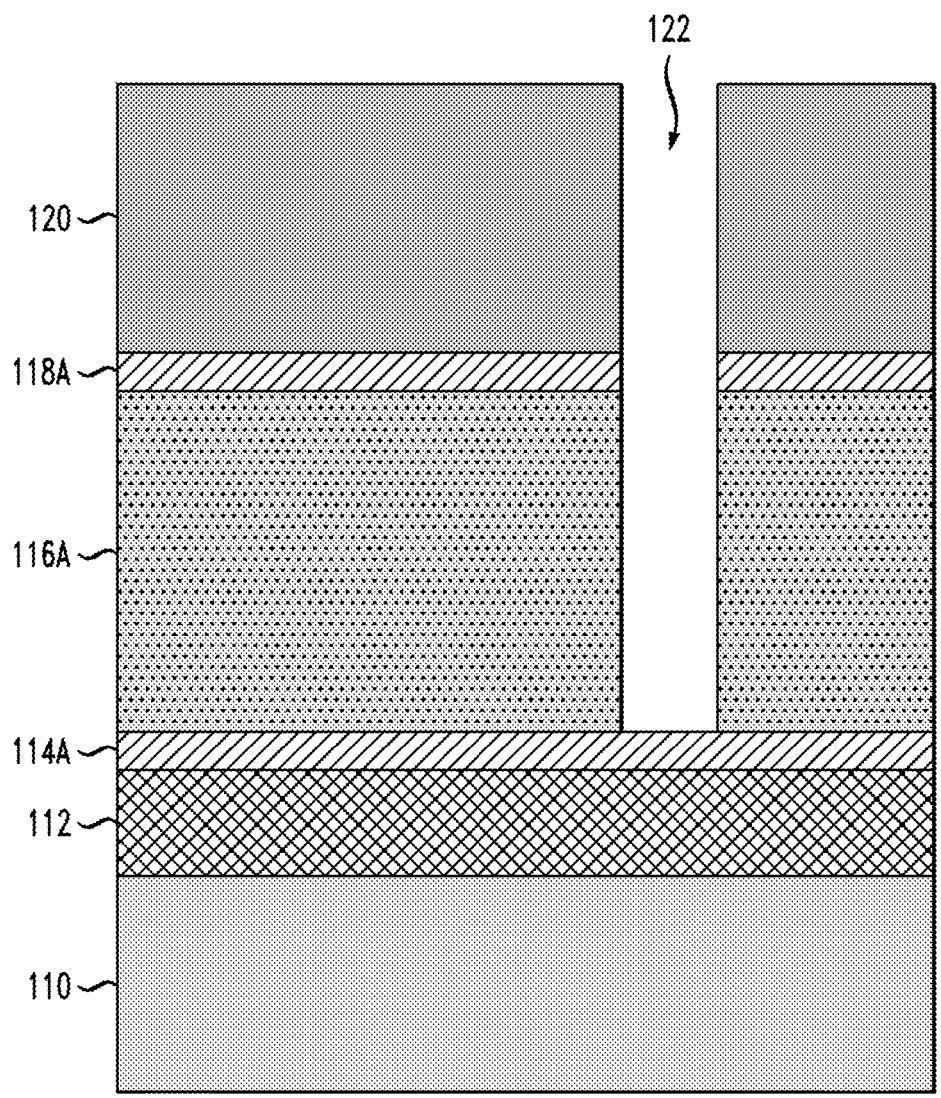

A next step in the fabrication process flow comprises etching one or more openings in the stack of layers which define a pattern of one or more semiconductor fins to be formed for the vertical FET device. For example, FIG. 4 is a schematic cross-sectional view of the semiconductor structure of FIG. 3 after etching a trench opening 122 through the layers 120, 118A, and 116A down to the first spacer layer 114A, according to an embodiment of the invention. The opening 122 defines a vertical semiconductor fin structure that is to be subsequently formed to provide a vertical channel for the vertical FET device. The opening 122 is formed using known techniques. For example, a layer of photoresist material is deposited on top of the layer of insulating material 120 and lithographically patterned (exposed and developed) to form a photoresist mask having a target pattern which defines a pattern of openings to be transferred to the stack of layers.

A directional dry etch process (e.g., plasma etch) is then performed using the photoresist mask to etch the trench opening 122 down to the first spacer layer 114A. With this process, the directional dry etch process is performed with an etch chemistry that is suitable to form high-aspect ratio trench openings with substantially vertical sidewalls through the stack of layers 120, 118A and 116A. The etch process can be performed using one continuous etch process, or a sequence of separate etch processes with different etch chemistries, using techniques and etch chemistries that are suitable to etch the materials that form the different layers 120, 118A and 116A.

Figure 5:
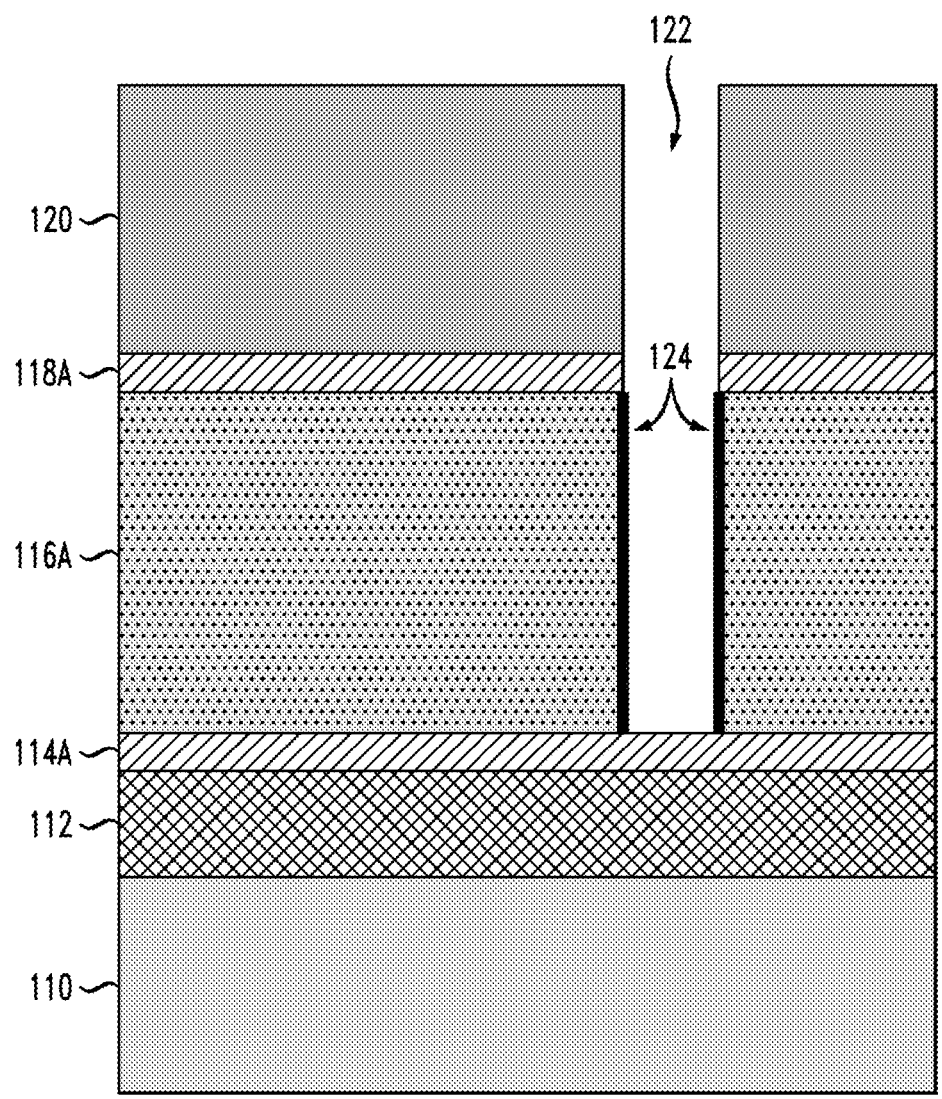

A next step in the fabrication process flow comprises forming a thin oxide layer on the exposed sidewall surfaces of the dummy gate layer 116A in the trench opening 122. For example, FIG. 5 is a schematic cross-sectional view of the semiconductor structure of FIG. 4 after forming a thin layer of oxide 124 on the expose surfaces of the dummy gate layer 116A within the trench opening 122, according to an embodiment of the invention. In one embodiment, the thin oxide layer 124 has a thickness in a range of about 1 nm to about 2 nm. The thin oxide layer 124 can be formed using a plasma oxidation process, or any other suitable technique for selectively oxidizing the exposed sidewall surfaces of the dummy gate layer 116A within the trench opening 122. The thin oxide layer 124 serves to protect a sidewall surface of the vertical semiconductor fin 130 (i.e., vertical channel structure) during subsequent RMG processing steps.

Figure 6:
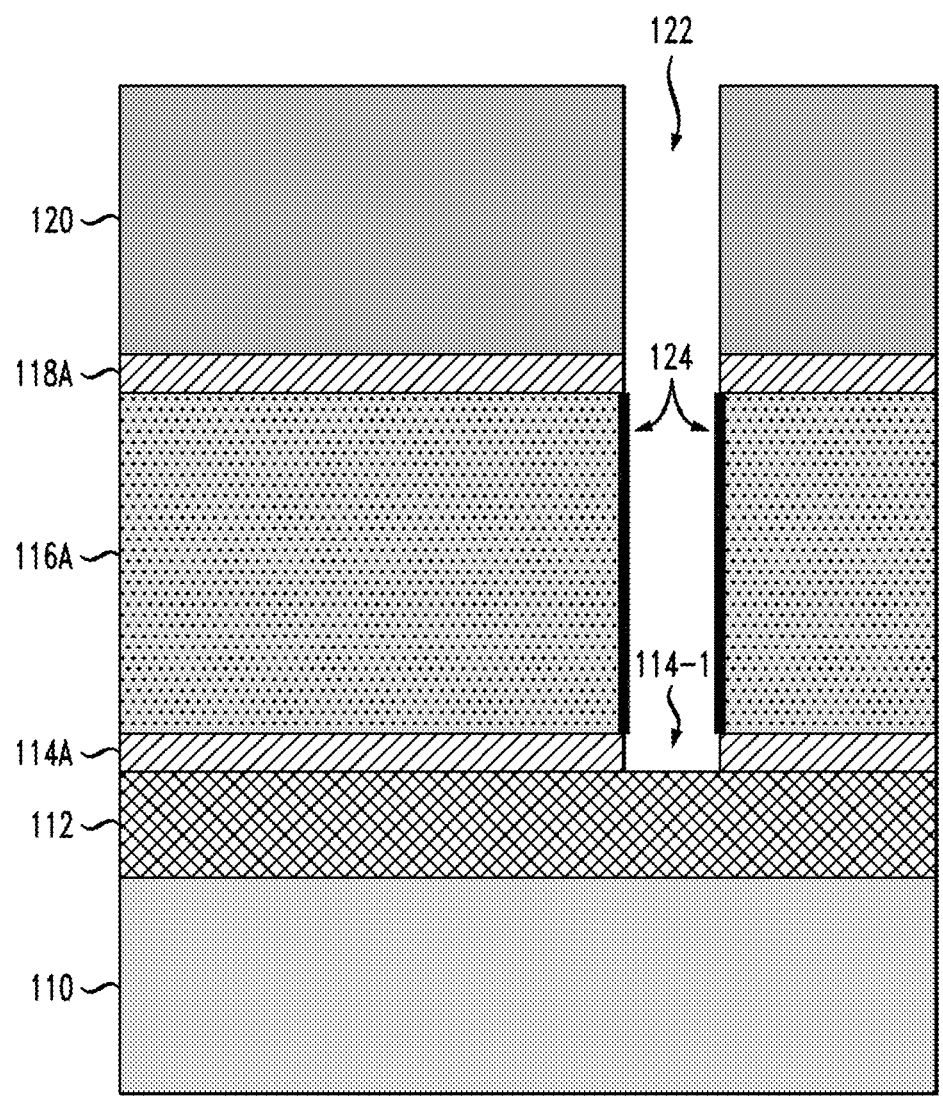

Following the selective oxidation of the sidewall surfaces of the dummy gate layer 116A within the trench opening 122, a next step comprises etching the exposed portion of the first spacer layer 114A at the bottom of the trench opening 122. For example, FIG. 6 is a schematic cross-sectional view of the semiconductor structure of FIG. 5 after etching an opening 114-1 in the first spacer layer 114A at the bottom of the trench opening 122, according to an embodiment of the invention. In one embodiment, the exposed material of the first spacer layer 114A is etched using a suitable etch process and etch chemistry to etch the first spacer layer 114A selective to the underlying material of the lower source/drain region 112.

Figure 7:
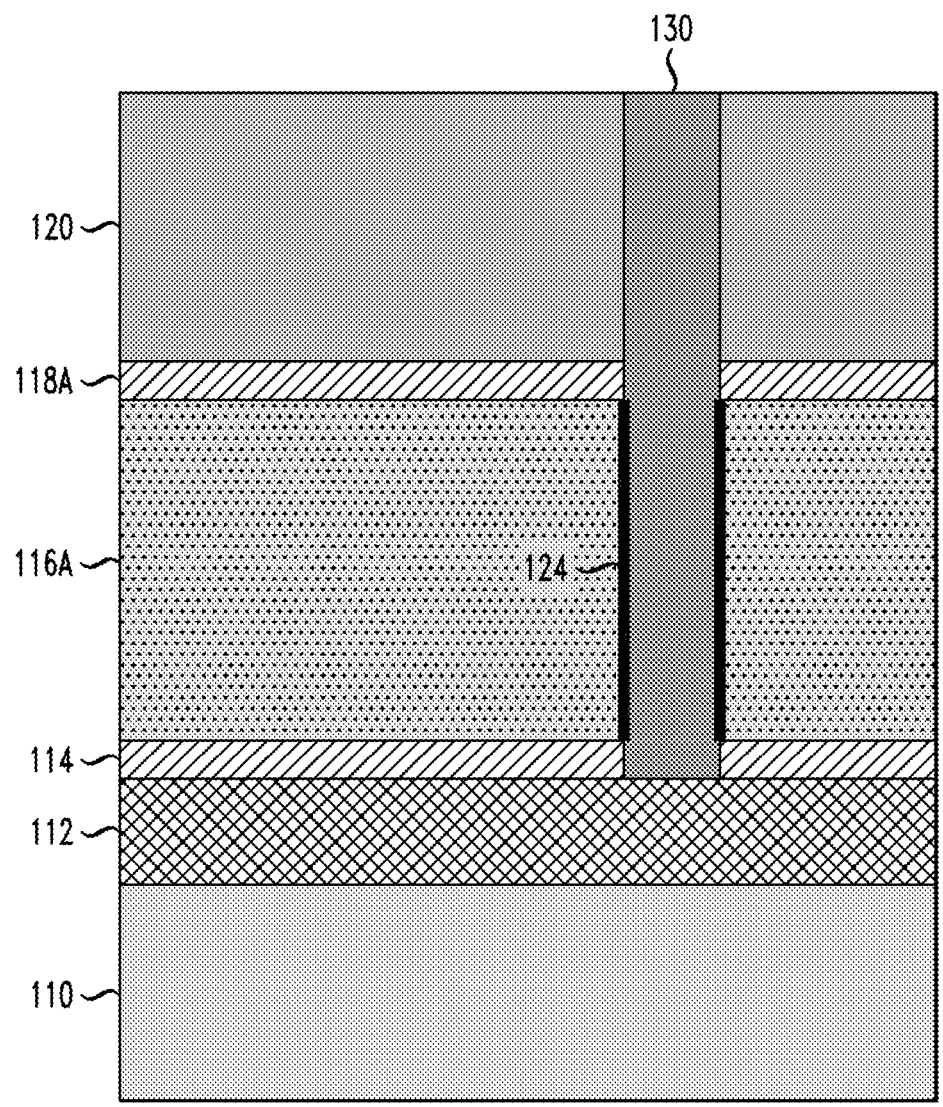

A next step in the fabrication process flow comprises forming a vertical semiconductor fin in each the trench opening 122. For example, FIG. 7 is a schematic cross-sectional view of the semiconductor structure of FIG. 6 after forming the vertical semiconductor fin 130 within the trench opening 122, according to an embodiment of the invention. In one embodiment of the invention, the vertical semiconductor fin 130 comprises an epitaxial semiconductor material that is epitaxially grown bottom-up, starting on the exposed surface of the lower source/drain region 112 at the bottom of the trench opening 122. As noted above, in one embodiment of the invention, the vertical semiconductor fin 130 is formed of an epitaxial III-V compound semiconductor material that is the same or similar to the epitaxial III-V compound semiconductor material of the lower source/drain region 112. For example, the vertical semiconductor fin 130 can be formed of InGaAs for an n-type device, or InGaSb for an p-type device. The vertical semiconductor fin 130 can be epitaxially grown using known techniques, such as MOCVD, MBE, VPE, or other known epitaxial growth techniques. In addition, in one embodiment, the epitaxial III-V compound semiconductor material of the vertical semiconductor fin 130 can be lightly doped with n-type or p-type dopants, as desired. Following the epitaxial growth process, the overburden epitaxial semiconductor material that protrudes from the trench opening 122 is removed using a CMP (chemical mechanical planarization) process, which results in a planarized surface, as shown in FIG. 7.

Figure 8:
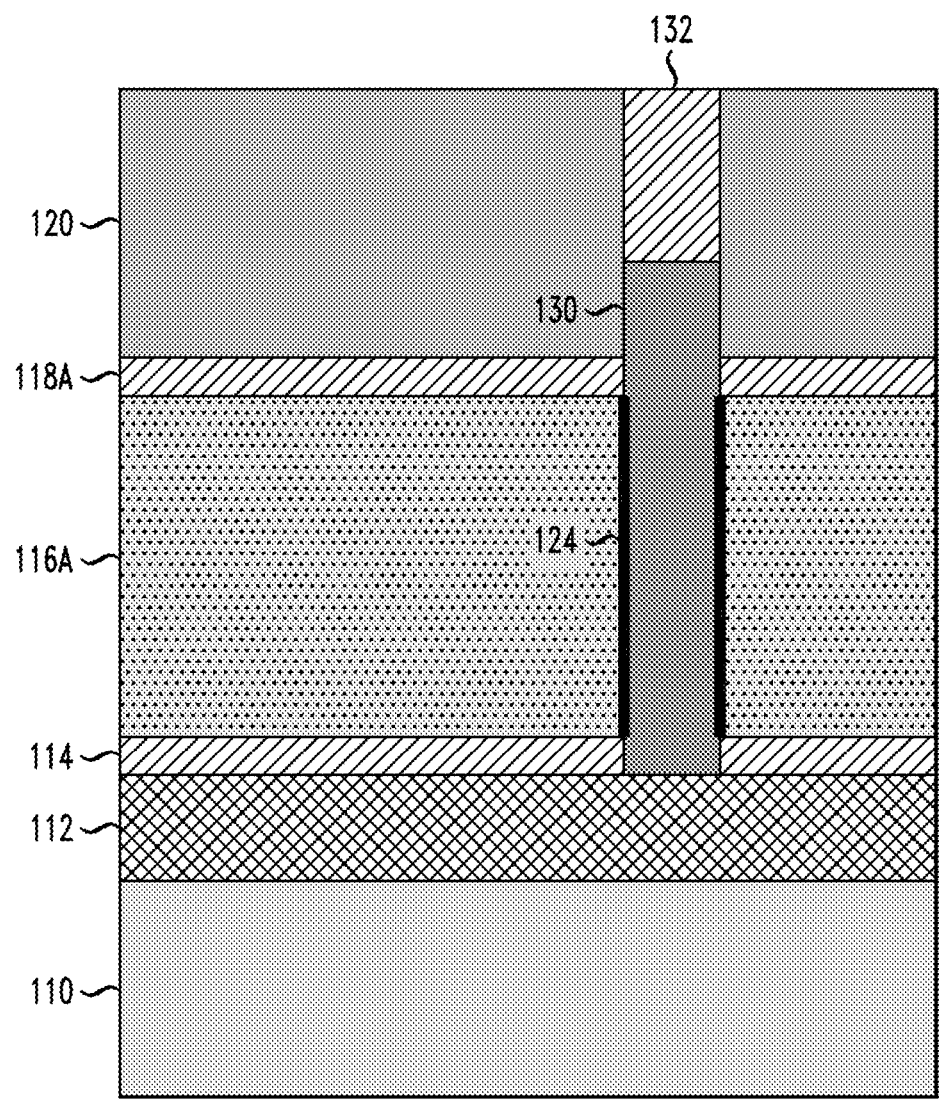

Next, as shown in FIG. 8, an etch process is performed to recess an upper portion of the vertical semiconductor fin 130, followed by forming a capping layer on top of the recessed vertical semiconductor fin 130. In particular, FIG. 8 is schematic cross-sectional view of the semiconductor structure of FIG. 7 after recessing the vertical semiconductor fin 130 down below the planarized surface of the insulating layer 120, and filling an upper portion of the trench opening 122 with the capping layer 132. In one embodiment, the upper portion of the vertical semiconductor fine 130 can be etched using an RIE (reactive ion etch) process with a suitable etch chemistry. After recessing the vertical semiconductor fin 130, a layer of insulating material, such as silicon nitride, is deposited to fill the upper portion of the trench opening 122 with insulating material. Following deposition, a CMP process is performed to remove the overburden insulating material, and planarize the surface of the insulating layer 120, resulting in the formation of the capping layer 132, as shown in FIG. 8. In one embodiment of the invention, the capping layer 132 is formed of silicon nitride, or any other suitable insulating/dielectric material that has etch selectivity with respect to the material (e.g., oxide) of the insulating layer 120.

Figure 9:
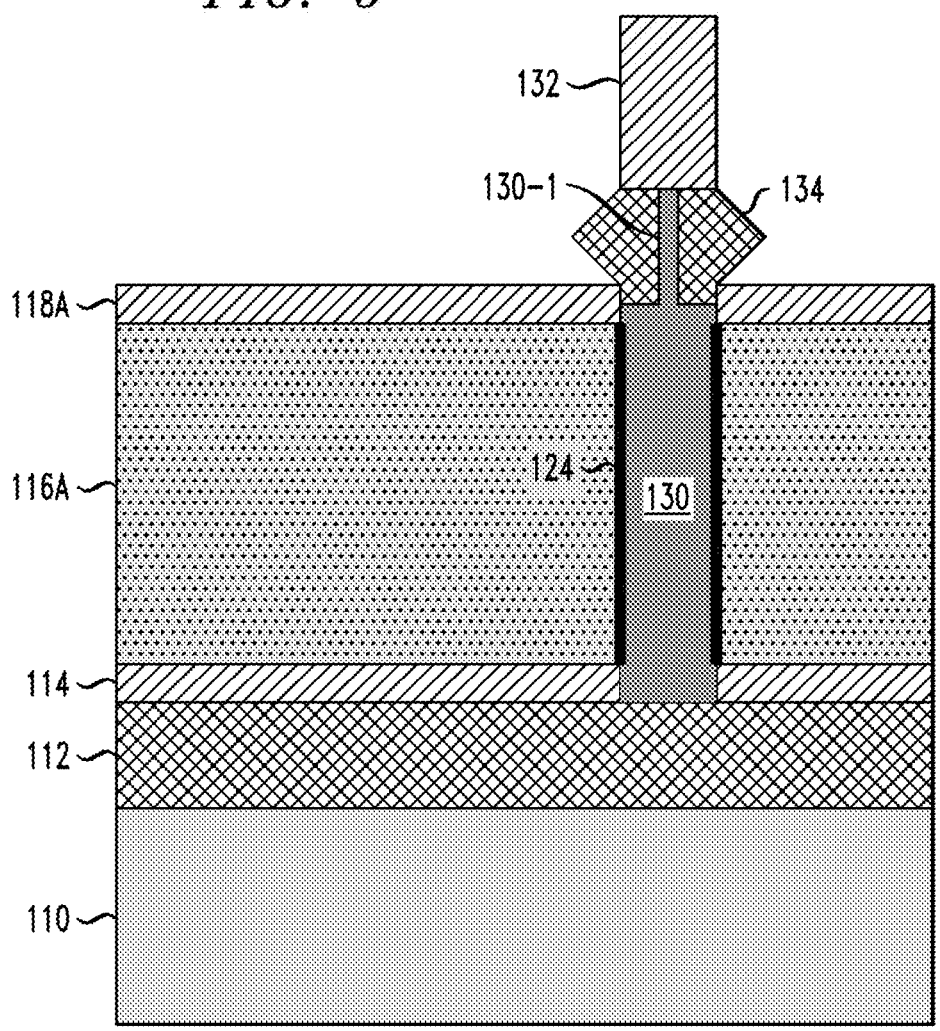

Following formation of the capping layer 132, the fabrication process continues with a process flow that comprises removing the insulating layer 120, laterally recessing exposed sidewall surfaces of the upper portion of the vertical semiconductor fin 130, and epitaxially growing an upper source/drain region on the recessed sidewall surfaces of the semiconductor fin 130. For example, FIG. 9 is schematic cross-sectional view of the semiconductor structure of FIG. 8 after etching away the insulating layer 120 down to the second spacer layer 118A, forming a thinned vertical fin structure 130-1, and epitaxially growing the upper source/drain region 134 on the thinned vertical fin structure 130-1.

The insulating layer 120 (e.g., oxide layer) can be removed using any suitable etch process with an etch chemistry that etches the material of the insulating layer 120 selective to the materials of the second spacer layer 118A, the capping layer 132, and the vertical semiconductor fin 130. Once the insulating layer 120 is removed, the exposed sidewall surfaces of the vertical semiconductor in 130 are laterally recessed to form the thinned vertical fin structure 130-1. In one embodiment, the exposed sidewall surfaces of the vertical semiconductor fin 130 can be etched using a timed dry etch process (e.g., ME) process or a timed wet etch process, in which the amount of sidewall material etched away is controlled by a timed etch. In one embodiment of the invention, wherein the original width of the vertical semiconductor fin 130 is in a range of about 6 nm to about 15 nm, the sidewalls of the vertical semiconductor fin 130 can be laterally etched to a distance about 1 nm to 2 nm, for example, to form the thinned vertical fin structure 130-1.

After forming the thinned vertical fin structure 130-1, the upper source/drain region 134 is formed by epitaxially growing a layer of III-V compound semiconductor material on the recessed sidewalls of the thinned vertical fin structure 130-1. As noted above, when forming the upper source/drain region 134, the composition of the III-V alloy material is controlled to tune the bandgap of the upper source/drain region to a desired value. For example, in one embodiment of the invention, for an n-type vertical FET device, the upper source/drain region 134 can be formed by epitaxially growing a faceted layer of an InGaAlAs alloy material with a bandgap that is custom-tuned for the intended application. As discussed above with reference to FIG. 2, the bandgap of an InGaAs alloy material can be tuned by changing the composition of InGaAs to include Al, wherein the relative concentration of Al and Ga is varied to create a custom composition of InGaAlAs material ($In_xGa_yAl_{1-x-y}As$) having a custom-tuned band gap. The InGaAlAs alloy layer can be epitaxially grown on the upper region of the semiconductor fin 130 using MBE and doped with a n-type dopant such as Te.

By way of further example, in another embodiment of the invention, for a p-type vertical FET device, the upper source/drain region 134 can be formed by epitaxially growing a faceted layer of InGaAlSb material with a bandgap that is custom-tuned for the intended application. In one embodiment, the band gap of an InGaSb alloy material can be tuned by changing the composition of InGaSb to include Al, wherein the relative concentration of Al and Ga is varied to create a custom composition of InGaAlSb material ($In_x$-$Ga_yAl_{1-x-y}Sb$) having a custom-tuned band gap. The InGaAlSb alloy layer can be epitaxially grown on the upper region of the semiconductor fin 130 using MBE and doped with a p-type dopant such as Be.

As schematically illustrated in FIG. 9, the upper source/drain region 134 of III-V material, which is epitaxially grown on the recessed sidewalls of the thinned vertical fin structure 130-1, comprises a trapezoidal or diamond-shaped structure. In one embodiment, when forming the upper source/drain region 134, the epitaxial growth process proceeds until enough epitaxial III-V semiconductor material is grown on the recessed sidewalls of the thinned vertical fin structure 130-1 to replace the amount (in thickness) of the original semiconductor material that was laterally etched away from the exposed sidewalls of the vertical semiconductor fin structure 130.

Irrespective of the type of III-V material used, the bandgap of the upper source drain region 134 can be tuned by controlling the composition of the III-V material to obtain an alloy material with a target bandgap. For example, the composition of the III-V material that forms the upper source/drain region 134 can be engineered to obtain a wider bandgap which serves to decrease the leakage of current (e.g., drain current) due to the band-to-band tunneling which takes place between the upper source/drain region 134 and the vertical channel 130.

Figure 10:
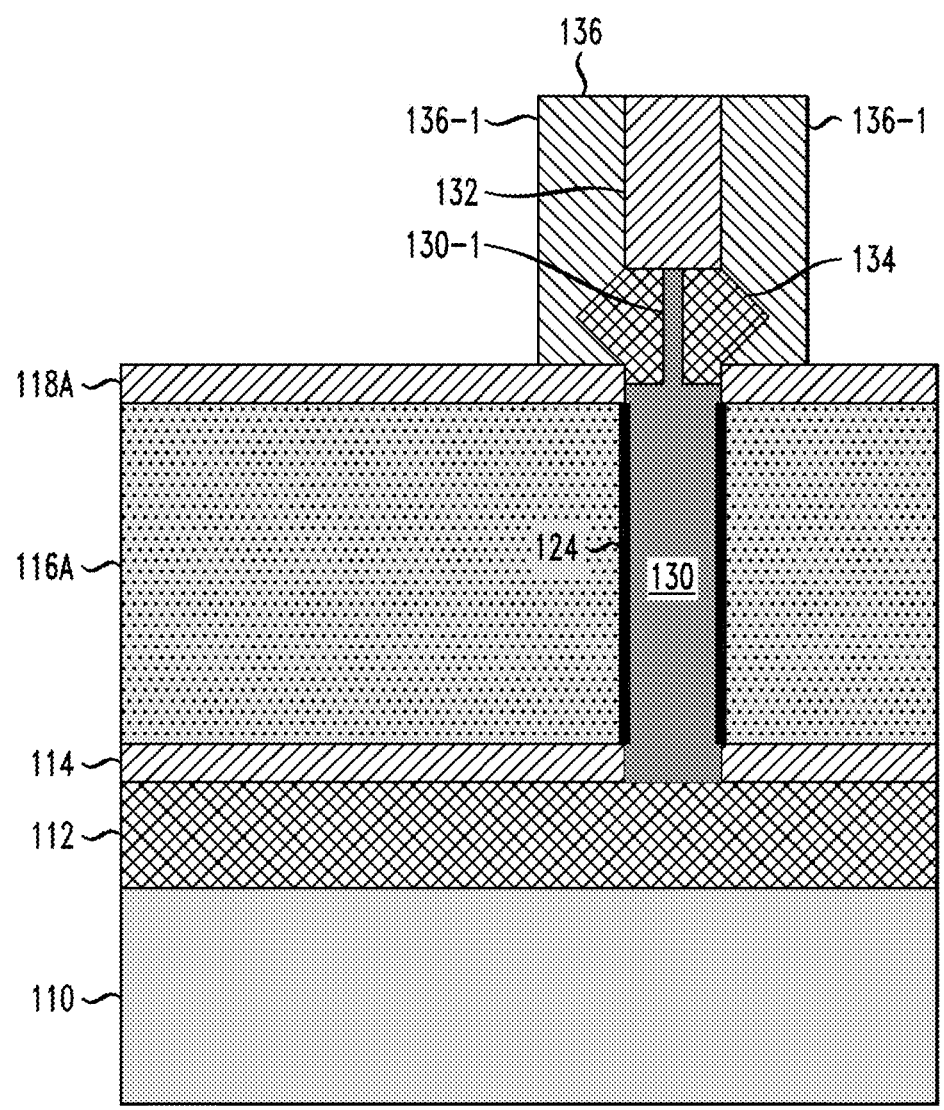
Figure 11:
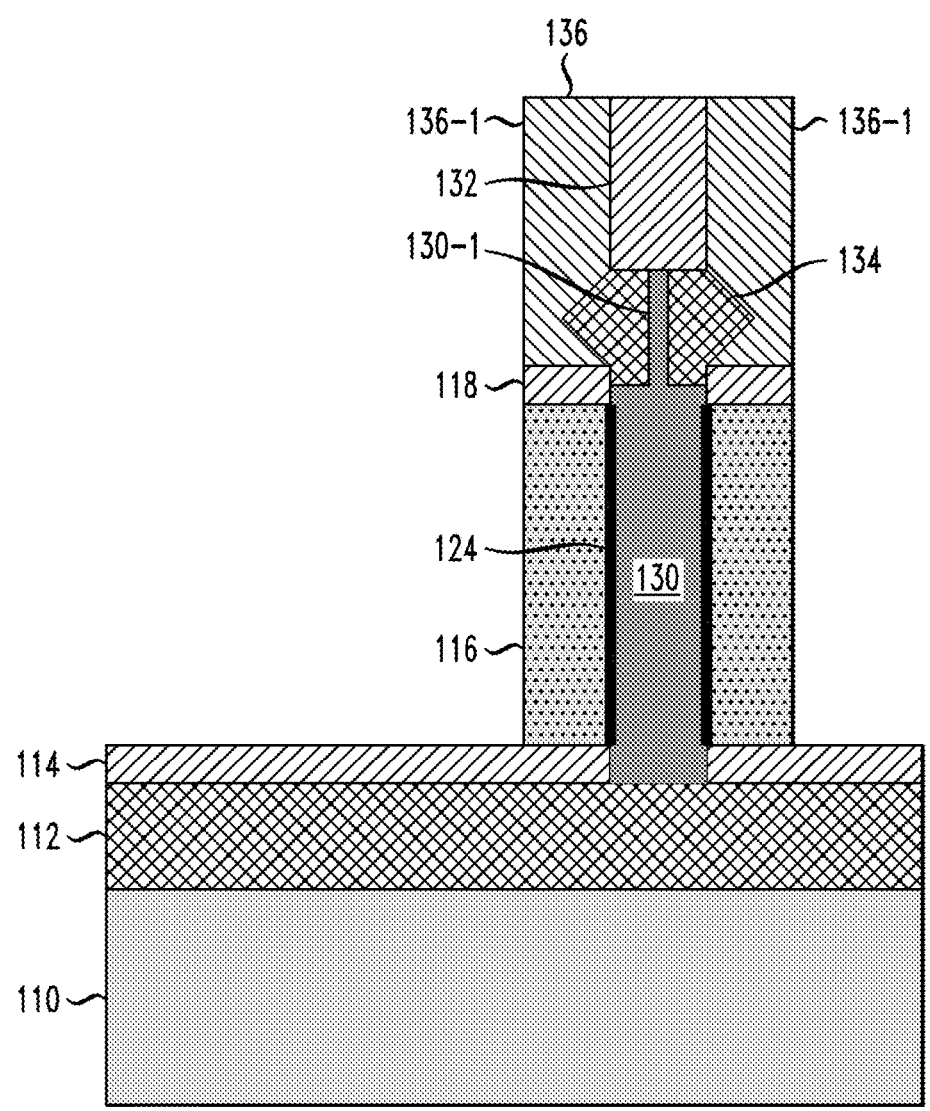

Following formation of the upper source/drain region 134, FIGS. 10 and 11 schematically illustrate a next sequence of steps in the fabrication process which comprise encapsulating the upper source/drain region 134 in an insulating material which serves to protect the upper source/drain region 134, and which is patterned to form an encapsulation layer that is used as an etch mask to pattern the second spacer layer 118A and the dummy gate layer 116A. In particular, FIG. 10 is a schematic cross-sectional side view of the semiconductor structure of FIG. 9 after forming the encapsulation structure 136 (e.g., a spacer-like structure) that encapsulates the upper source/drain region 134, according to an embodiment of the invention. In one embodiment of the invention, the encapsulation structure 136 is formed by a process which comprises blanket depositing a layer of insulating material (such as silicon nitride) over the semiconductor structure shown in FIG. 9, planarizing the layer of insulating material down to the capping layer 132, and then forming an etch mask to pattern the planarized layer of insulating material to form the encapsulation structure 136 with vertical sidewalls 136-1, as shown in FIG. 10.

The vertical sidewalls 136-1 of the encapsulation structure 136 extend past the vertical sidewalls of the vertical semiconductor fin 130 at a given distance which defines the footprint of the device structures that are to be formed after etching the underlying layers 118A and 116A using the encapsulation structure 136 as an etch mask. In particular, FIG. 11 is a schematic cross-sectional side view of the semiconductor structure of FIG. 10 after using the encapsulation structure 136 as an etch mask during one or more sequential etch processes that are performed to vertically etch the exposed portions of the underlying layers 118A and 116A down to the lower spacer 114, and thereby form the upper spacers 118 and the dummy gate structure 116, as shown in FIG. 11.

Figure 12:
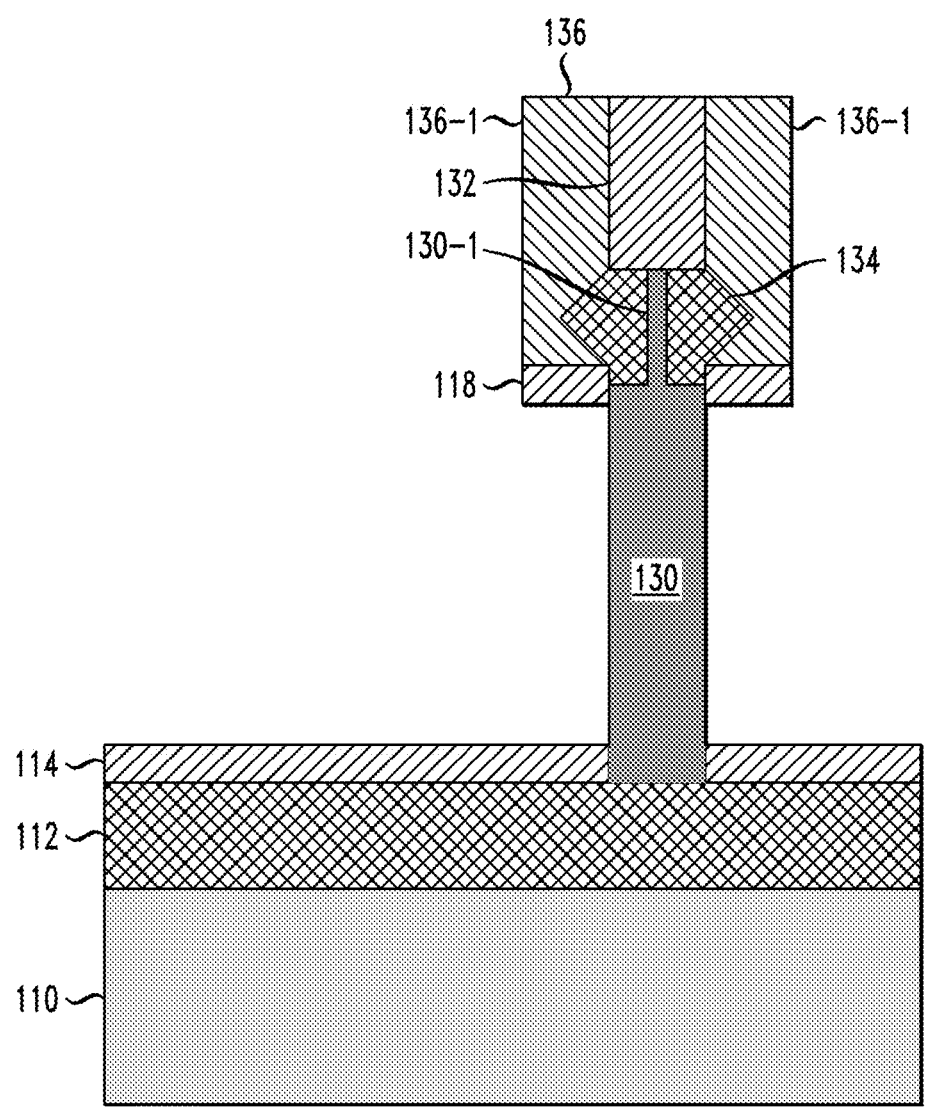

Next, the dummy gate structure 116 is removed and replaced with a metal gate structure 140/150 as part of an RMG process, as schematically illustrated in FIGS. 12 through 17. As an initial step, FIG. 12 is a schematic cross-sectional side view of the semiconductor structure of FIG. 11 after sequentially removing the dummy gate structure 116 and the thin oxide layer 124 to expose the sidewall surfaces of the vertical semiconductor fin 130, according to an embodiment of the invention. With this process, the dummy gate structure 116 is removed using a suitable etch process and etch chemistry to remove the amorphous silicon material of the dummy gate structure 116 selective to the materials of the surrounding structures (e.g., structures 114, 118, 124, 132, 136, etc.). The thin oxide layer 124 serves to protect the sidewall surfaces of the vertical semiconductor fin 130 from being etched during the dummy gate etch process. After the dummy gate structure 116 is removed, another etch process is performed to remove the thin oxide layer 124 selective to the surrounding structures (e.g., structures 114, 118, 130, 132, 136, etc.), resulting in the semiconductor structure shown in FIG. 12.

Figure 13:
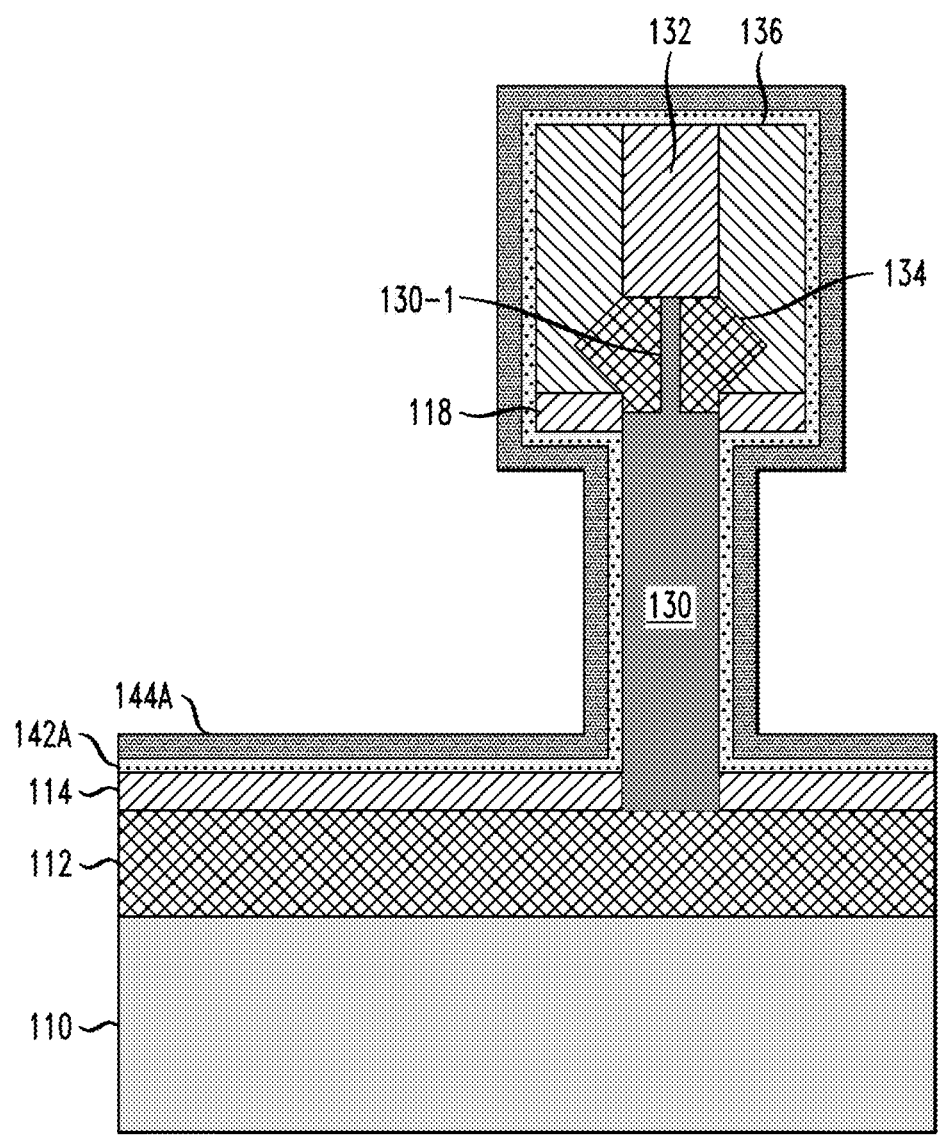

After the removing the dummy gate structure 116 and the thin oxide layer 124, the process continues with sequentially depositing a conformal layer of gate dielectric material and a conformal layer of metallic gate material, which are subsequently patterned to form the high-k metal gate stack structure 140 shown in FIG. 1A. In particular, FIG. 13 is a schematic cross-sectional side view of the semiconductor structure of FIG. 12 after sequentially depositing a thin conformal layer of gate dielectric material 142A and a thin conformal layer of metallic gate material 144A (work function metal) over the semiconductor structure of FIG. 12.

In one embodiment, the conformal layer of gate dielectric material 142A comprises a high-k dielectric material such as, $HfO_2$, $HfSiO_4$, HfSiON, $ZrO_2$, $Al_2O_3$, $TiO_2$, $Ta_2O_5$ $La_2O_3$, $SrTiO_3$, $LaAlO_3$, and combinations thereof. In one embodiment, the conformal layer of dielectric material 142A is deposited with a thickness in a range of about 0.5 nm to about 2.5 nm, which will vary depending on the target application. The conformal layer of dielectric material is deposited using known methods such as ALD, CVD, or PVD, for example.

Further, in one embodiment, the conformal layer of metallic gate material 144A serves as a work function metal (WFM) that may be formed of a metallic material such as Zr, W, Ta, Hf, Ti, Al, Ru, Pa, TaN, TiN, metal oxides, metal carbides, metal nitrides, transition metal aluminides (e.g. $Ti_3Al$, ZrAl), TaC, TiC, TaMgC, or any combination thereof. The type of work function metal used will vary depending on whether the vertical FET device is an n-type or p-type device.

Figure 14:
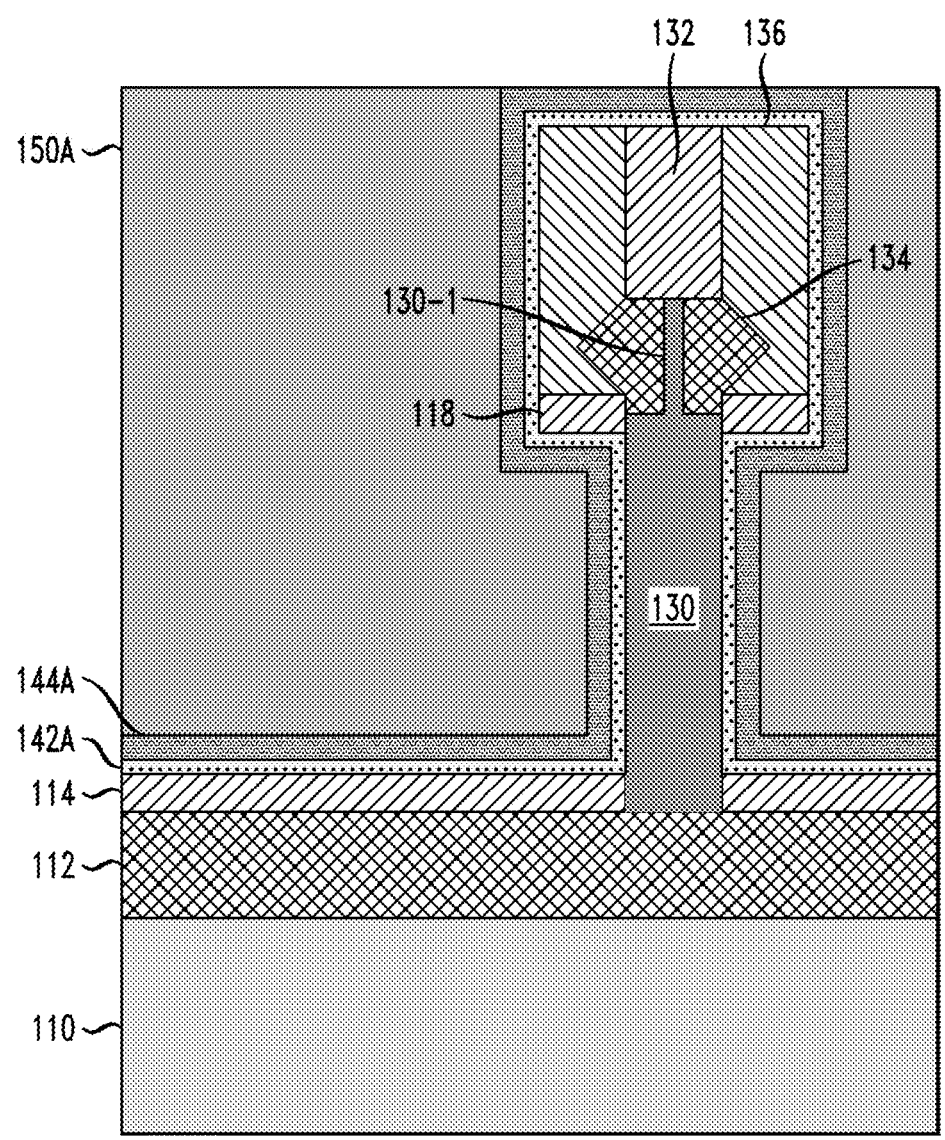

Next, FIG. 14 is a schematic cross-sectional side view of the semiconductor structure of FIG. 13 after depositing and planarizing a layer of gate electrode material 150A, which is subsequently patterned to form the gate electrode 150 shown in FIG. 1A. In one embodiment, the layer of gate electrode material 150A comprises a low-resistance conductive material including, but not limited to tungsten, aluminum, or any metallic or conductive material that is commonly used to form gate electrode structures. The layer of gate electrode material 150A can be deposited by CVD or PE-CVD, and planarized via CMP. As shown in FIG. 14, the layer of gate electrode material 150A is planarized down to the layer of metallic gate material 144A on top of the encapsulation structure 136.

Figure 15:
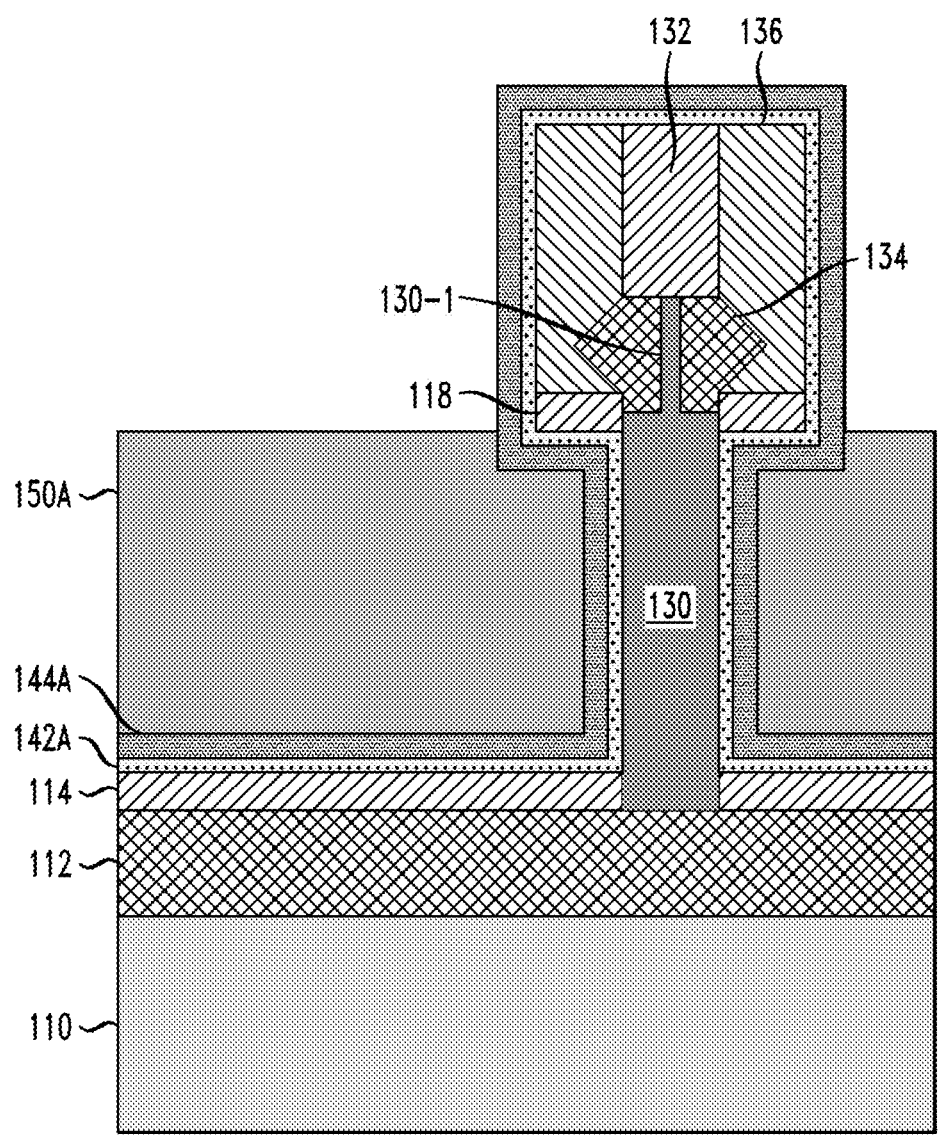

After planarizing the layer of gate electrode material 150A, a next step comprises recessing the layer of gate electrode material 150A down to a target level. For example, FIG. 15 is a schematic cross-sectional side view of the semiconductor structure of FIG. 14 after recessing the layer of gate electrode material 150A down to a target level, which in one embodiment of the invention, is approximately coplanar with a bottom surface of the upper insulating spacer 118, as schematically shown in FIG. 15. The layer of gate electrode material 150A can be recessed using a suitable etch process (e.g., RIE).

Figure 16:
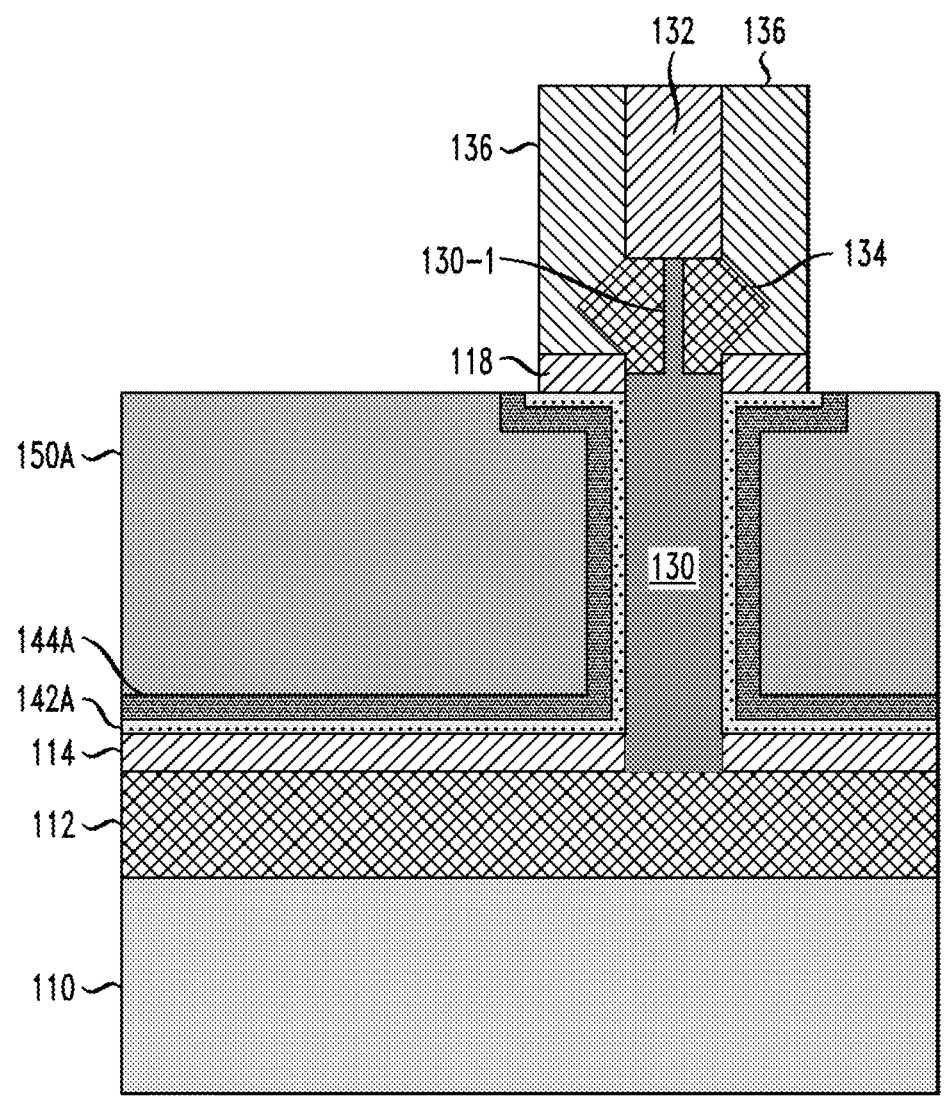
Figure 17:
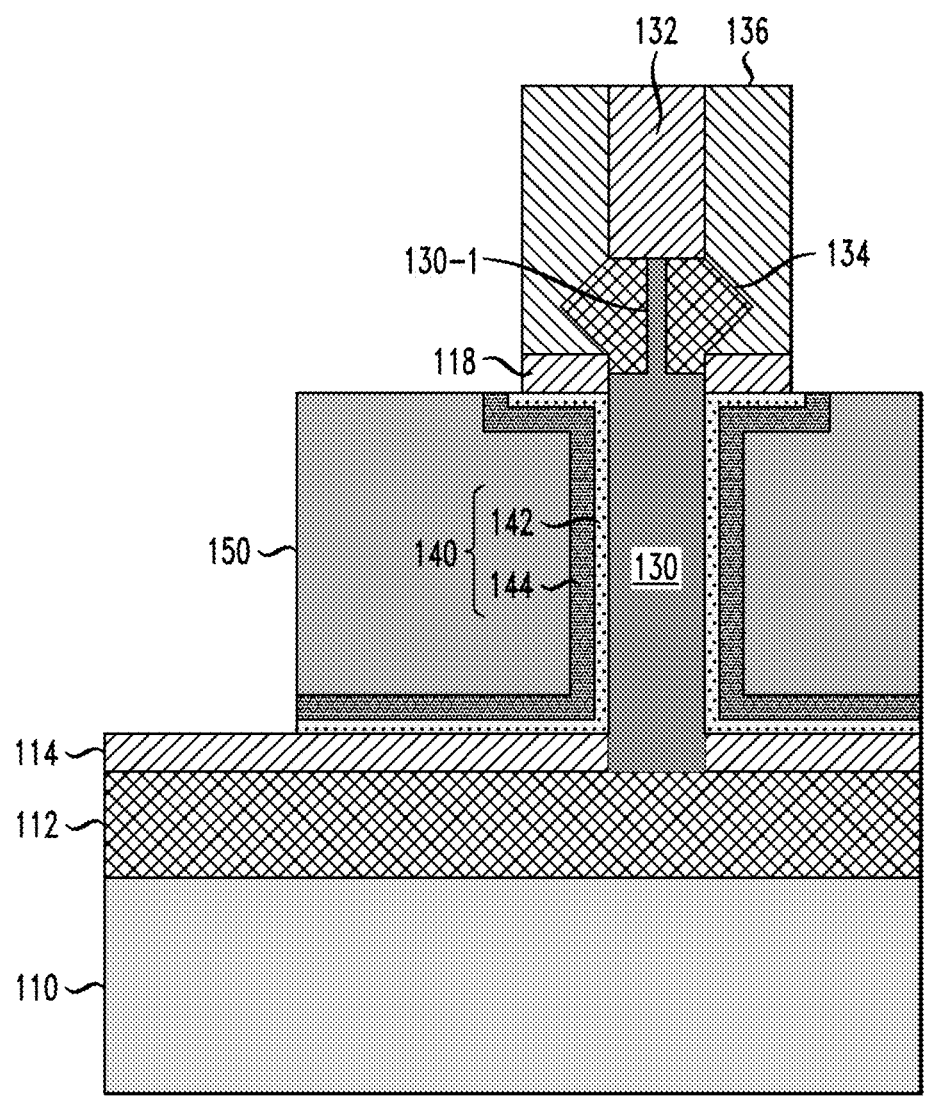

Next, FIG. 16 is a schematic cross-sectional side view of the semiconductor structure of FIG. 15 after removing exposed portions of the conformal layer of gate dielectric material 142A and the conformal layer of metallic gate material 144A on the encapsulation structure 136, which portions are exposed after recessing the gate electrode material layer 150A. In one embodiment, the exposed portions of the layers of gate dielectric material 142A and metallic gate material 144A are remove using a sequence of RIE steps with suitable etch chemistries. Further, FIG. 17 is a schematic cross-sectional side view of the semiconductor structure of FIG. 16 after performing a gate lithography process to pattern the recessed layer of gate electrode material 150A and the remaining portions of the gate dielectric material layer 142A and the metallic gate material layer 144A to form the metal gate structure (140/150) of the vertical FET device as shown in FIG. 24. The metal gate structure (140/150) comprises the patterned gate electrode 152 and the patterned high-k metal gate structure 150.

Figure 18:
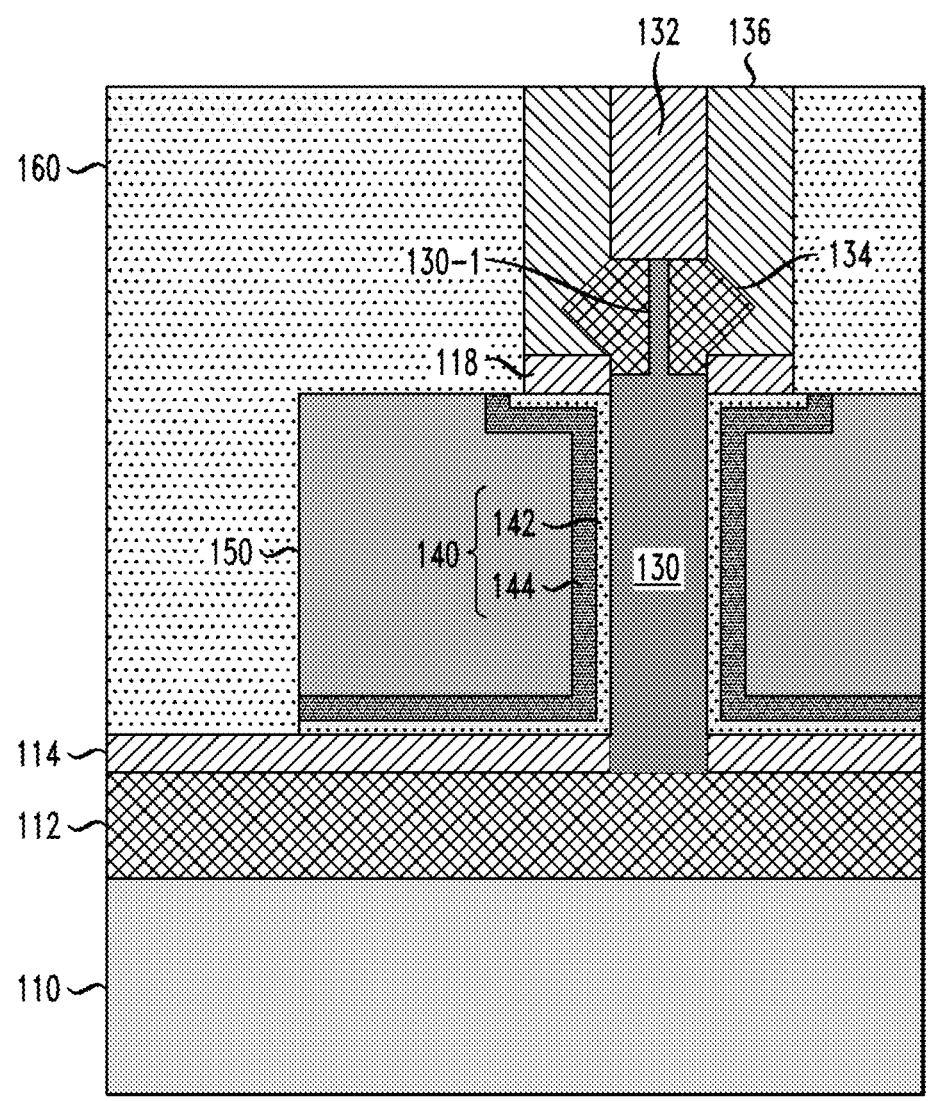

After forming the replacement metal gate structure (140/150), the process flow continues with forming the ILD layer 160 (or what is sometimes referred to as a PMD (pre-metal dielectric) layer) and patterning openings in the ILD layer 160 which are filled with conductive material to form vertical contacts. For example, FIG. 18 is a schematic cross-sectional side view of the semiconductor structure of FIG. 17 after depositing and planarizing a layer of dielectric material to form the ILD layer 160. The ILD layer 160 is formed by depositing a layer of dielectric material over the surface of the semiconductor structure of FIG. 27, and then planarizing the dielectric material down to the upper surface of the encapsulation structure 136136, as shown in FIG. 18. The ILD layer 160 may be formed with any suitable insulating/dielectric materials such as, for example, silicon oxide, silicon nitride, hydrogenated silicon carbon oxide, silicon based low-k dielectrics, porous dielectrics, or organic dielectrics including porous organic dielectrics, etc. The ILD layer 160 may be formed using known deposition techniques, such as, for example, ALD, CVD, PECVD, spin on deposition, or PVD, followed by a standard planarization process (e.g., CMP) to planarize the upper surface of the ILD layer 160.

Figure 19:
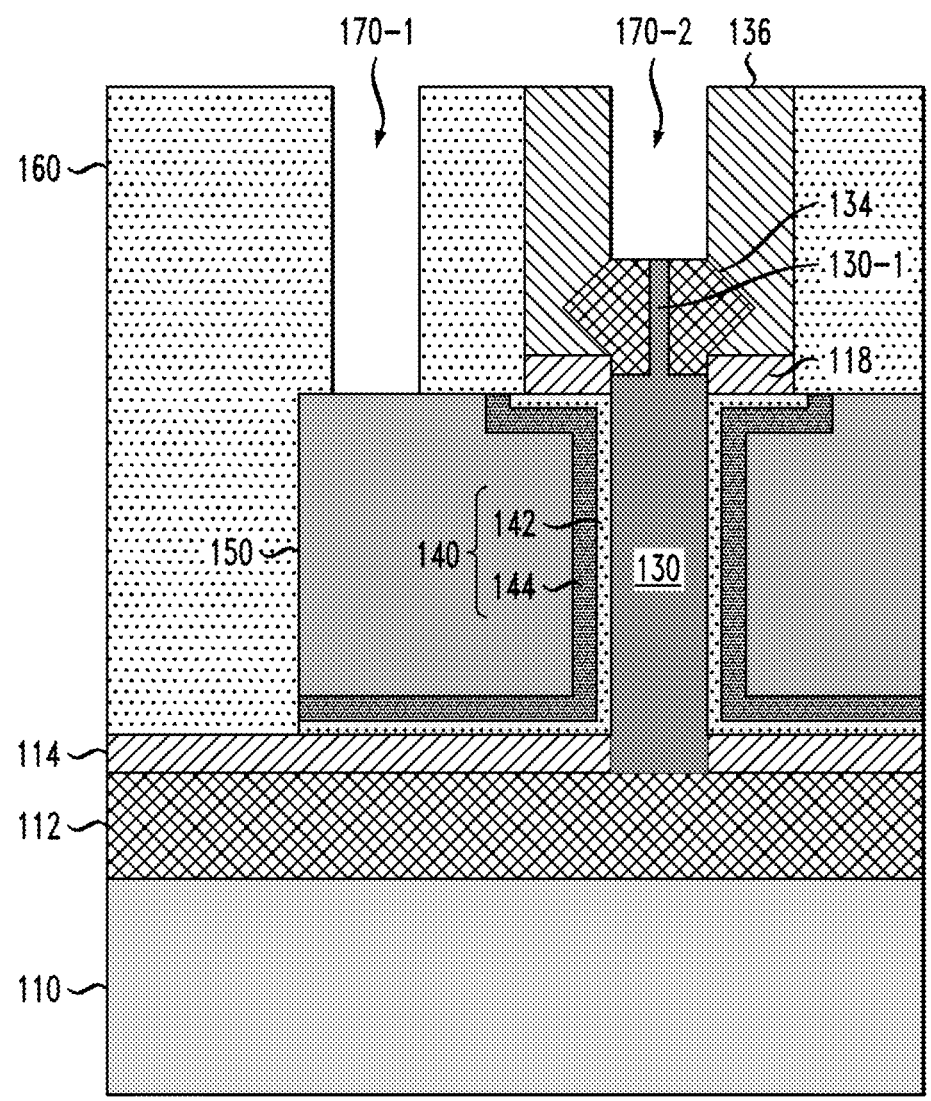

Next, FIG. 19 is a schematic cross-sectional side view of the semiconductor structure of FIG. 18 after etching a pattern of contact openings 170-1 and 170-2 (and other contact openings not specifically shown in FIG. 19) which are subsequently filled with conductive material to form the vertical source, drain and gate contacts (e.g., contacts 171, 172 and 173 shown in FIGS. 1A/1B), according to an embodiment of the invention. As shown in FIG. 19, the contact opening 170-1 is formed through the ILD layer 160 down to the gate electrode 150, and the contact opening 170-2 is etched through the capping layer 132 down to the upper source/drain region 134. The contact openings (e.g., 170-1 and 170-2) can be formed by a photolithographic process which comprises forming a photoresist layer on the planarized surface of the semiconductor structure shown in FIG. 18 and then patterning (exposing and developing) the photoresist layer to form a photoresist mask having a pattern which corresponds to the pattern of contact openings that are to be etched in the surface of the semiconductor structure for the vertical contacts 171, 172 and 173 shown in FIGS. 1A/1B.

After forming the contact openings (e.g., 160-1, 170-2), the vertical contacts 171, 172, and 173 as shown in FIGS. 1A and 1B are formed by filling the contact openings with conductive materials using known techniques. For example, a thin conformal liner layer can be initially deposited to line the sidewall surfaces of the contact openings with a thin conformal barrier diffusion layer (e.g., TiN or TaN, etc.), followed by the deposition of a conductive filler material to fill the contact openings with conductive material such as copper, tungsten, cobalt, aluminum, or other conductive materials that are suitable for use in forming conductive vertical contacts to the source/drain regions and gate electrodes. Following deposition of the conductive filler material, a CMP process is performed to remove the overburden liner and conductive filler material down to the surface of the ILD layer 160, resulting in the structure shown in FIG. 1A. Thereafter, a standard BEOL (back end of line) process can be performed to form an interconnect network connects the integrated circuit components formed on the active surface of the semiconductor substrate.

It is to be understood that the methods discussed herein for fabricating vertical semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor device, comprising:
  a vertical field effect transistor (FET) device formed on a semiconductor substrate, the vertical FET device comprising:
    a lower source/drain region formed on the semiconductor substrate;
    a vertical semiconductor fin formed on an upper surface of the lower source/drain region; and
    an upper source/drain region formed on an upper region of the vertical semiconductor fin;
  wherein the lower source/drain region and the vertical semiconductor fin are formed of a first type of III-V compound semiconductor material; and wherein the upper source/drain region is formed of a second type of III-V semiconductor material which comprises the first type of III-V compound semiconductor material and at least one additional element, wherein the at least one additional element increases a bandgap of the second type of III-V compound semiconductor material that forms the upper source/drain region relative to a bandgap of the first type of III-V compound semiconductor material that forms the lower source/drain region and the vertical semiconductor fin.

2. The device of claim 1, wherein the first type of III-V compound semiconductor material comprises a ternary III-V compound semiconductor material, and wherein the second type of III-V compound semiconductor material comprises a quaternary III-V compound semiconductor material.

3. The device of claim 1, wherein the semiconductor substrate comprises a III-V compound semiconductor material that is lattice-matched to the first type of III-V compound semiconductor material that forms the lower source/drain region.

4. The device of claim 1, wherein the vertical FET device further comprises:
a metal gate structure disposed around sidewall surfaces of the vertical semiconductor fin;
a lower spacer disposed between the lower source/drain region and the metal gate structure; and
an upper spacer disposed between the upper source/drain region and the metal gate structure.

5. The device of claim 1, wherein the lower source/drain region is a source region of the vertical FET device, and wherein the upper source/drain region is a drain region of the vertical FET device.

6. The semiconductor device of claim 1, wherein the at least one additional element comprises a group III element.

7. The semiconductor device of claim 1, wherein the at least one additional element comprises aluminum.

8. A method of fabricating a semiconductor device, the method comprising:
epitaxially growing a lower source/drain region on a semiconductor substrate;
epitaxially growing a vertical semiconductor fin on an upper surface of the lower source/drain region; and
epitaxially growing an upper source/drain region on an upper region of the vertical semiconductor fin;
wherein the lower source/drain region and the vertical semiconductor fin are formed of a first type of III-V compound semiconductor material; and
wherein the upper source/drain region is formed of a second type of III-V semiconductor material which comprises the first type of III-V compound semiconductor material and at least one additional element, wherein the at least one additional element increases a bandgap of the second type of III-V compound semiconductor material that forms the upper source/drain region relative to a bandgap of the first type of III-V compound semiconductor material that forms the lower source/drain region and the vertical semiconductor fin.

9. The method of claim 8, wherein epitaxially growing an upper source/drain region on an upper region of the vertical semiconductor fin comprises controlling an amount of the at least one additional element that is added to the first type of III-V compound semiconductor material to tune a bandgap of the upper source/drain region to a target value.

10. The method of claim 8, wherein the first type of III-V compound semiconductor material comprises a ternary III-V compound semiconductor material, and wherein the second type of III-V compound semiconductor material comprises a quaternary III-V compound semiconductor material.

11. The method of claim 8, wherein the semiconductor substrate comprises a III-V compound semiconductor material that is lattice-matched to the first type of III-V compound semiconductor material that forms the lower source/drain region.

12. The method of claim 8, further comprising:
forming a lower spacer;
forming an upper spacer; and
forming a metal gate structure disposed around sidewall surfaces of the vertical semiconductor fin;
wherein the lower spacer is disposed between the lower source/drain region and the metal gate structure; and
wherein the upper spacer is disposed between the upper source/drain region and the metal gate structure.

13. The method of claim 8, wherein the lower source/drain region is a source region of a vertical FET device, and wherein the upper source/drain region is a drain region of the vertical FET device.

14. The method of claim 8, wherein the at least one additional element comprises a group III element.

15. A semiconductor device formed by a process comprising:
epitaxially growing a lower source/drain region on a semiconductor substrate;
epitaxially growing a vertical semiconductor fin on an upper surface of the lower source/drain region; and
epitaxially growing an upper source/drain region on an upper region of the vertical semiconductor fin;
wherein the lower source/drain region and the vertical semiconductor fin are formed of a first type of III-V compound semiconductor material; and
wherein the upper source/drain region is formed of a second type of III-V semiconductor material which comprises the first type of III-V compound semiconductor material and at least one additional element, wherein the at least one additional element increases a bandgap of the second type of III-V compound semiconductor material that forms the upper source/drain region relative to a bandgap of the first type of III-V compound semiconductor material that forms the lower source/drain region and the vertical semiconductor fin.

16. The semiconductor device of claim 15, wherein epitaxially growing an upper source/drain region on an upper region of the vertical semiconductor fin comprises controlling an amount of the at least one additional element that is added to the first type of III-V compound semiconductor material to tune a bandgap of the upper source/drain region to a target value.

17. The semiconductor device of claim 15, wherein the first type of III-V compound semiconductor material comprises a ternary III-V compound semiconductor material, and wherein the second type of III-V compound semiconductor material comprises a quaternary III-V compound semiconductor material.

18. The semiconductor device of claim 15, wherein the semiconductor substrate comprises a III-V compound semiconductor material that is lattice-matched to the first type of III-V compound semiconductor material that forms the lower source/drain region.

19. The semiconductor device of claim 15, wherein the process further comprises:
forming a lower spacer;
forming an upper spacer; and
forming a metal gate structure disposed around sidewall surfaces of the vertical semiconductor fin;

wherein the lower spacer is disposed between the lower source/drain region and the metal gate structure; and wherein the upper spacer is disposed between the upper source/drain region and the metal gate structure.

20. The semiconductor device of claim 15, wherein the lower source/drain region is a source region of a vertical FET device, and wherein the upper source/drain region is a drain region of the vertical FET device.

* * * * *